US011114150B2

(12) United States Patent
Vogelsang et al.

(10) Patent No.: US 11,114,150 B2
(45) Date of Patent: Sep. 7, 2021

(54) MEMORY SYSTEM WITH MULTIPLE OPEN ROWS PER BANK

(71) Applicant: Rambus Inc., Sunnyvale, CA (US)

(72) Inventors: Thomas Vogelsang, Mountain View, CA (US); John Eric Linstadt, Palo Alto, CA (US); Liji Gopalakrishnan, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/838,646

(22) Filed: Apr. 2, 2020

(65) Prior Publication Data

US 2020/0335150 A1 Oct. 22, 2020

Related U.S. Application Data

(60) Provisional application No. 62/835,717, filed on Apr. 18, 2019.

(51) Int. Cl.
G11C 11/408 (2006.01)
G11C 11/4094 (2006.01)
G11C 11/4091 (2006.01)
G06F 13/42 (2006.01)

(52) U.S. Cl.
CPC ...... G11C 11/4085 (2013.01); G06F 13/4282 (2013.01); G11C 11/4091 (2013.01); G11C 11/4094 (2013.01)

(58) Field of Classification Search
None
See application file for complete search history.

(56) References Cited

U.S. PATENT DOCUMENTS

| 5,737,572 | A | 4/1998 | Nunziata |
| 5,778,446 | A | 7/1998 | Kim |
| 5,787,267 | A | 7/1998 | Leung et al. |
| 5,889,714 | A | 3/1999 | Schumann et al. |
| 6,125,422 | A | 9/2000 | May |
| 6,141,283 | A | 10/2000 | Bogin et al. |
| 6,587,934 | B2 | 7/2003 | Miura et al. |

(Continued)

OTHER PUBLICATIONS

Direct RDRAM™ 64/72-Mbit (256K×16/18×16d) Datasheet, Mar. 15, 2005. 63 pages.

(Continued)

Primary Examiner — James G Norman
(74) Attorney, Agent, or Firm — The Neudeck Law Firm, LLC

(57) ABSTRACT

A dynamic random access memory (DRAM) component (e.g., module or integrated circuit) can be configured to have multiple rows in the same bank open concurrently. The controller of the component divides the address space of the banks into segments based on row address ranges. These row address ranges do not necessarily correspond to row address ranges of the bank's subarrays (a.k.a. memory array tiles—MATs). When a command is sent to open a row, the controller marks a plurality of the segments as blocked. The controller thereby tracks address ranges in a bank where it will not open a second row unless and until the first row is closed. The memory component may store information about which, and how many, segments should be blocked in response to opening a row. This information may be read by the controller during initialization.

20 Claims, 17 Drawing Sheets

(56) References Cited

U.S. PATENT DOCUMENTS

| | | |
|---|---|---|
| 6,799,241 B2 | 9/2004 | Kahn et al. |
| 6,910,109 B2 | 6/2005 | Holman et al. |
| 7,079,440 B2 | 7/2006 | Remaklus, Jr. et al. |
| 7,308,526 B2 | 12/2007 | Lakshmanamurthy et al. |
| 7,369,456 B2 | 5/2008 | Schnieder |
| 7,986,582 B2 | 7/2011 | Ruckerbauer et al. |
| 2005/0193183 A1 | 9/2005 | Barth et al. |
| 2011/0022791 A1* | 1/2011 | Iyer ...................... G06F 3/0652 711/105 |

OTHER PUBLICATIONS

Yoongun Kim et al. "Exploiting the DRAM Microarchitecture to Increase Memory-Level Parallelism", arXiv:1805.01966v1 May 4, 2018. 9 pages.

* cited by examiner

RECEIVE, FROM A MEMORY DEVICE, INFORMATION ASSOCIATING ROW ADDRESSES OF A DRAM DEVICE TO RESPECTIVE INDICATORS THAT ARE TO BE SET TO A FIRST VALUE IN RESPONSE TO COMMANDS TO THE DRAM DEVICE TO OPEN ROWS, THE RESPECTIVE INDICATORS ASSOCIATED WITH A RESPECTIVE PLURALITY OF ROW ADDRESS SEGMENTS, THE ROW ADDRESS SEGMENTS CORRESPONDING TO RESPECTIVE ROW ADDRESS RANGES
1302

SET A PLURALITY OF THE RESPECTIVE INDICATORS TO THE FIRST VALUE, THE PLURALITY OF THE RESPECTIVE INDICATORS BEING SET TO THE FIRST VALUE IN RESPONSE TO AT LEAST THE MEMORY CONTROLLER PROCESSING A COMMAND TO THE DRAM DEVICE TO OPEN A FIRST ROW IN THE RESPECTIVE ROW ADDRESS RANGE ASSOCIATED WITH AT LEAST ONE OF THE RESPECTIVE INDICATORS, THE FIRST VALUE BEING ASSOCIATED WITH THE RESPECTIVE ASSOCIATED ROW ADDRESS SEGMENTS BEING UNAVAILABLE FOR OPENING A SECOND ROW IN THE ASSOCIATED RESPECTIVE ROW ADDRESS RANGE
1304

*FIG. 13*

MEMORY SYSTEM WITH MULTIPLE OPEN ROWS PER BANK

BRIEF DESCRIPTION OF THE DRAWINGS

FIG. 13 is a flowchart illustrating a method of controlling a memory device.

DETAILED DESCRIPTION OF THE EMBODIMENTS

In an embodiment, a dynamic random access memory (DRAM) component (e.g., module or integrated circuit) may have multiple rows in the same bank open concurrently. The controller of the DRAM component divides the address space of the banks into segments based on row address ranges. These row address ranges do not necessarily correspond to row address ranges of the bank's subarrays (a.k.a. memory array tiles—MATs). When a command is sent to open a row, the controller marks a plurality of the segments (i.e., row address ranges) as blocked. The controller thereby tracks address ranges in a bank where it will not open a second row unless and until the first row is closed. In an embodiment, the memory component stores information about which, and how many, segments should be blocked in response to opening a row. This information is read by the controller during initialization.

Because more than one row in a bank may be open concurrently, column access operations sent to the memory component specify which row is the subject of the column access. In an embodiment, the entire row address is used to specify the subject row. In another embodiment, a map of open rows to tag values is maintained by the memory component. The memory controller sends a tag value to specify the subject row. These tag values may be generated, for example, using a function (e.g., hash) of the row address, using a count of the open rows, or using a priority encoder.

Figure 1:
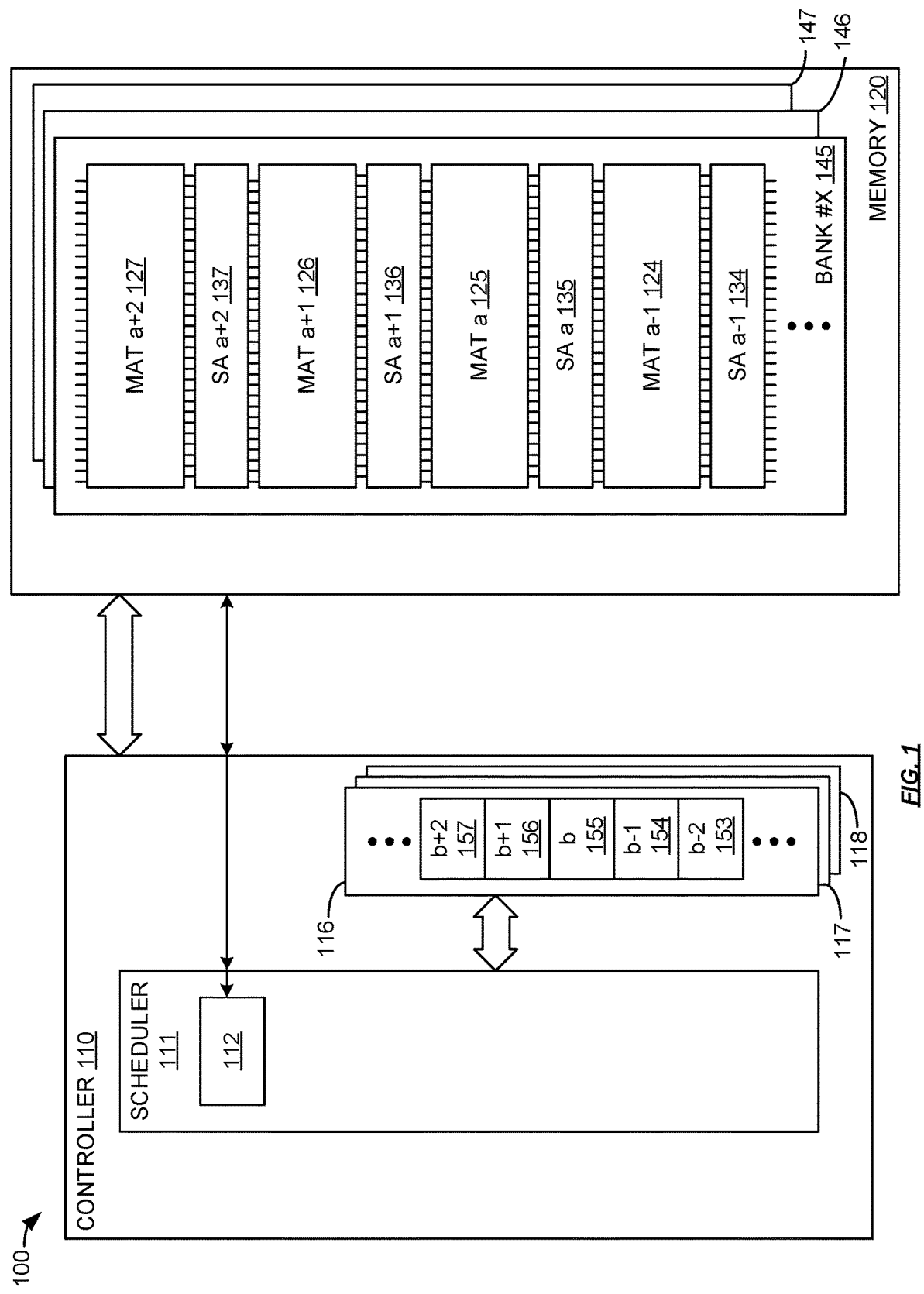
FIG. 1 is a block diagram illustrating a memory system.

FIG. 1 is a block diagram illustrating a memory system. In FIG. 1, memory system 100 comprises controller 110, and memory component 120. Memory component 120 includes memory banks 145-147. Memory banks 145-147 include subarrays of memory cells (a.k.a., memory array tiles—MATs) 124-127. Between subarrays are sense amplifier stripes 134-137. Controller 110 includes scheduler 111, configuration 112, and address tables 116-118. Address tables 116-118 store entries 153-157.

Controller 110 and memory component 120 may be integrated circuit type devices, such as are commonly referred to as a "chips". A memory controller, such as controller 110, manages the flow of data going to and from memory devices and/or memory modules. Memory 120 may be a standalone device, or may be a memory module, or component thereof. A memory controller can be a separate, standalone chip, or integrated into another chip. For example, a memory controller may be included on a single die with a microprocessor, or included as part of a more complex integrated circuit system such as a block of a system on a chip (SOC).

Controller 110 is operatively coupled to memory 120 via at least one command address interface. Controller 110 is operatively coupled to memory 120 to send commands to memory 120. Memory 120 receives the commands (and addresses) via a corresponding command address interface.

In an embodiment, memory 120 may be configured (e.g., placed in a first mode) to operate according to DRAM protocols that only allow one row per bank to be open at a time. Memory 120 may also be configured (e.g., placed in a second mode) such that multiple rows in the same bank 145-147 may be open concurrently as long as the open rows are in subarrays 124-127 that do not share a sense amplifier stripe 134-137. Thus, for example, when memory 120 activates a row in a subarray 124-127, the two sense amplifier stripes 134-137 surrounding the subarray 134-137 are used to activate the addressed row and the rest of the sense amplifier stripes in the bank 145-147 do not participate in the activation. Memory 120 may be placed in the first mode or the second mode by, for example, setting a value in a mode register, asserting a signal on a pin during reset, startup, or initialization, and/or other means such as via a test interface.

To activate/read a row in MAT a 125, for example, sense amplifier stripe a 135 and sense amplifier stripe a+1 136 are used to read the contents of the addressed row while sense amplifier stripe a−1 134 and sense amplifier stripe a+2 137 remain in their previous states. Accordingly, a second row in MAT a−1 124 cannot be opened because MAT a−1 uses sense amplifier stripe a 135 (which is already being used by the open row in MAT a 125.) Likewise, a second row in MAT a+1 126 cannot be opened because MAT a+1 uses sense amplifier stripe a+1 136 (which is also already being used by the open row in MAT a 125.) However, a row in MAT a+2 127 may be open(ed) because MAT a+2 uses sense amplifier a+2 137 and sense amplifier stripe a+3 (not shown in FIG. 1.)

Controller 110 includes scheduler 111. Scheduler 111 selects transactions/commands to be sent to memory 120. Scheduler 111 maintains address tables 116-118 for banks 145-147 that indicate which address ranges are blocked due to open rows. The entries in the address tables (e.g., entries 153-157 stored in address table 116) may correspond to respective address ranges and hold one or more indicators of whether the address range is available or unavailable for opening a row in that address range. The entries 153-157 in address tables 116-118 may comprise a single bit or other value corresponding to whether or not the address range is available for opening a row. The entries 153-157 in address tables 116-118 may comprise a value that that tracks when an address range will become available. For example, when memory 120 is configured to auto-precharge, a timer value may be incremented or decremented under certain conditions to track when the precharge will be complete and therefore the address range becomes available.

When the row addresses associated with each subarray 124-127 begin and end on powers of two (i.e., each MAT 124-127 has $2^i$ rows, where i is a positive integer), then each entry 153-157 in address tables 116-118 may correspond to a single respective MAT 124-127. Thus, in this case, there may be a one-to-one correspondence between entries 153-157 and MATs 124-127. In other words, entry b−1 154 may indicate whether a row in MAT a−1 124 may be opened; entry b 155 may indicate whether a row in MAT a 125 may be opened, and so on. If the entry 153-157 indicates the MAT 124-127 is unavailable for opening a row, scheduler 111 may refrain from sending a command to memory 120 to open the row until the MAT 124-127 becomes available. When a row is opened, the entry (e.g., entry b 155) corresponding to the MAT (e.g., MAT a 125) with the opened row, and the two adjacent entries (e.g., entry b−1 154 for MAT a−1 124 and entry b+1 156 for MAT a+1 126) are marked as being unavailable (a.k.a., blocked) for opening a row. Conversely, when the row is closed, the entry (e.g., entry b 155) corresponding to the MAT (e.g., MAT a 125) with the previously open row, and the two adjacent entries (e.g., entry b−1 154 for MAT a−1 124 and entry b+1 156 for MAT a+1 126) are marked as being available (a.k.a., unblocked) for opening a row.

When the row addresses associated with each subarray 124-127 do not begin and end on powers of two, controller 110 may use the full row address to determine which MAT 124-127 (and therefore which entry 153-157 in address table 116 holds the indicator) holds the addressed row. Once the MAT (e.g., MAT a 125) holding the row addressed for opening is determined, the entry (e.g., entry b 155) corresponding to the MAT with row addressed for opening, and the two adjacent entries (e.g., entry b−1 154 for MAT a−1 124 and entry b+1 156 for MAT a+1 126) are marked a being unavailable for opening a row. Similarly, once the MAT (e.g., MAT a 125) holding the row addressed for closing is determined, the entry (e.g., entry b 155) corresponding to the MAT with row addressed for closing, and the two adjacent entries (e.g., entry b−1 154 for MAT a−1 124 and entry b+1 156 for MAT a+1 126) are marked as being available for opening a row.

In an embodiment, entries 153-157 correspond to address ranges that are powers of two, but the row addresses associated with each subarray 124-127 do not begin and end on powers of two. In this case, the address ranges (a.k.a., segments) associated with each entry 153-157 may be greater than or less than the number of rows in each subarray 124-127. Controller 110 marks the segment associated with the open row and a configured number (which may be greater than 1) of entries 153-157 on either side of the segment associated with the open row as blocked. When that configured number is selected properly in relation to the number of rows in each MAT 124-127, and the size of the address ranges associated with each entry 153-157, controller 110 views (at least) the two MATs 124-127 adjacent to the MAT with the open row as being blocked. In an embodiment, the size of the address ranges for each entry 153-157 and the number of surrounding segments to be marked blocked is read from memory 120.

Figure 2A:
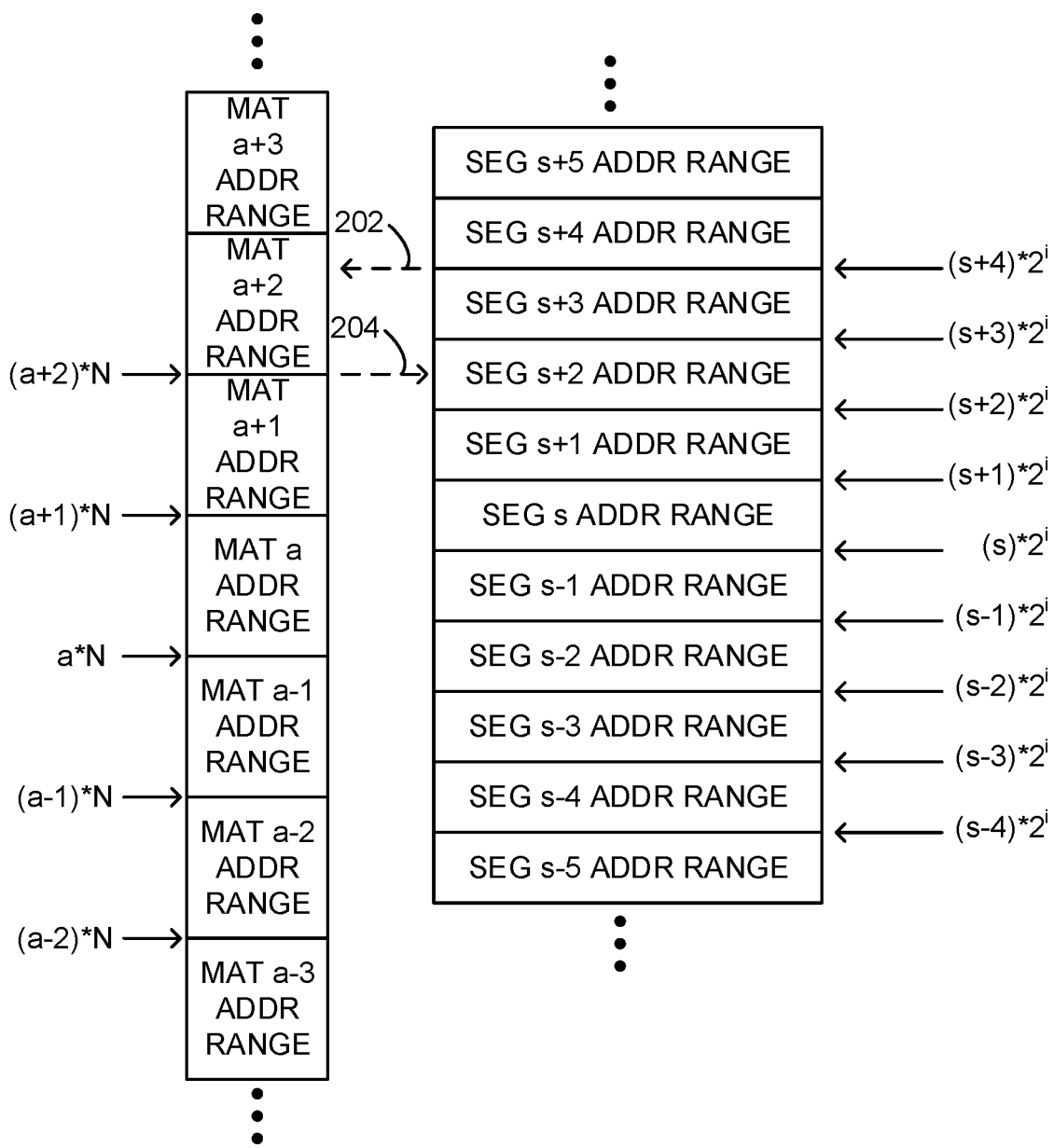
FIGS. 2A-2C are diagrams illustrating blocking segments.
Figure 2B:
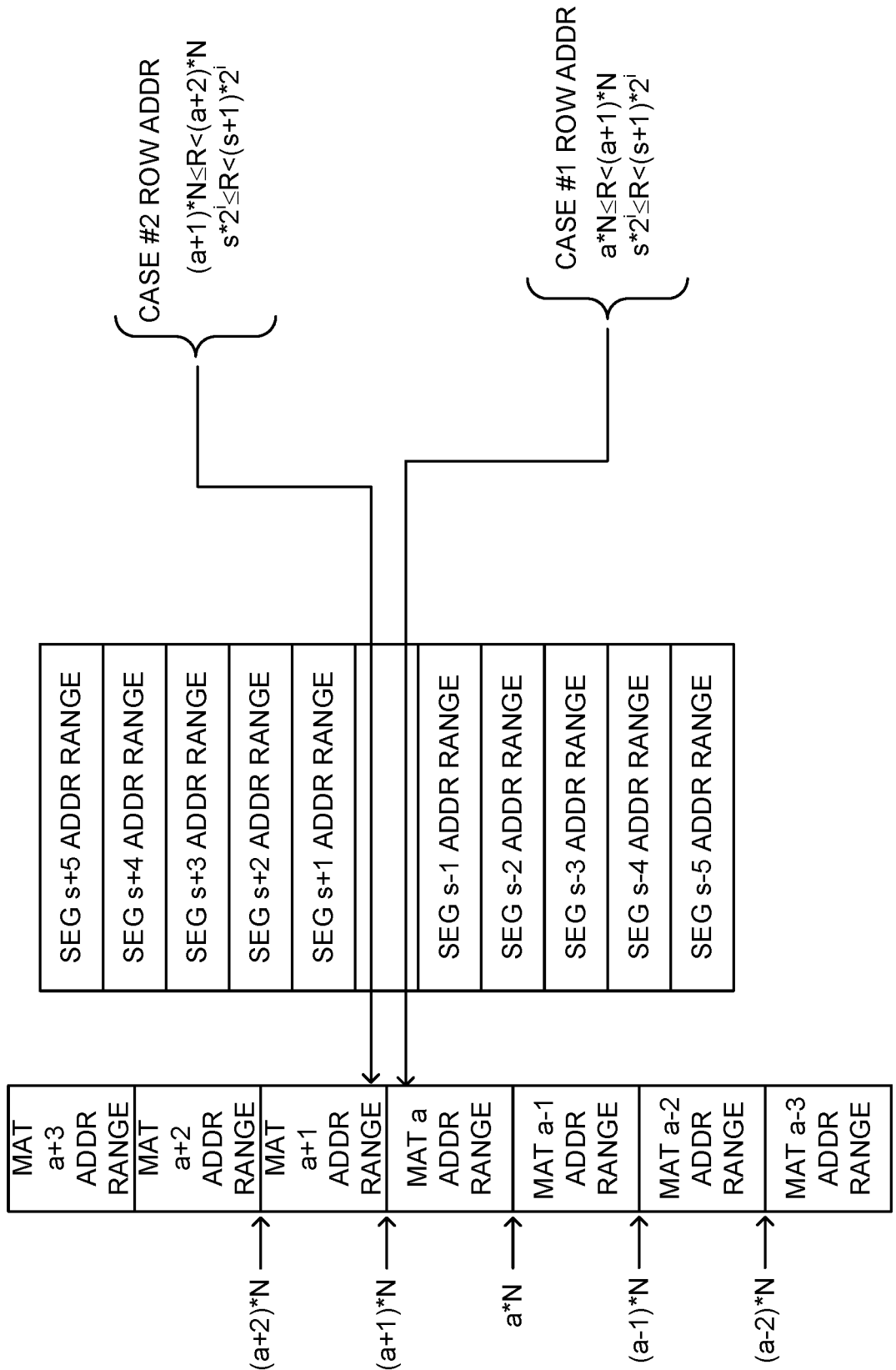
Figure 2C:
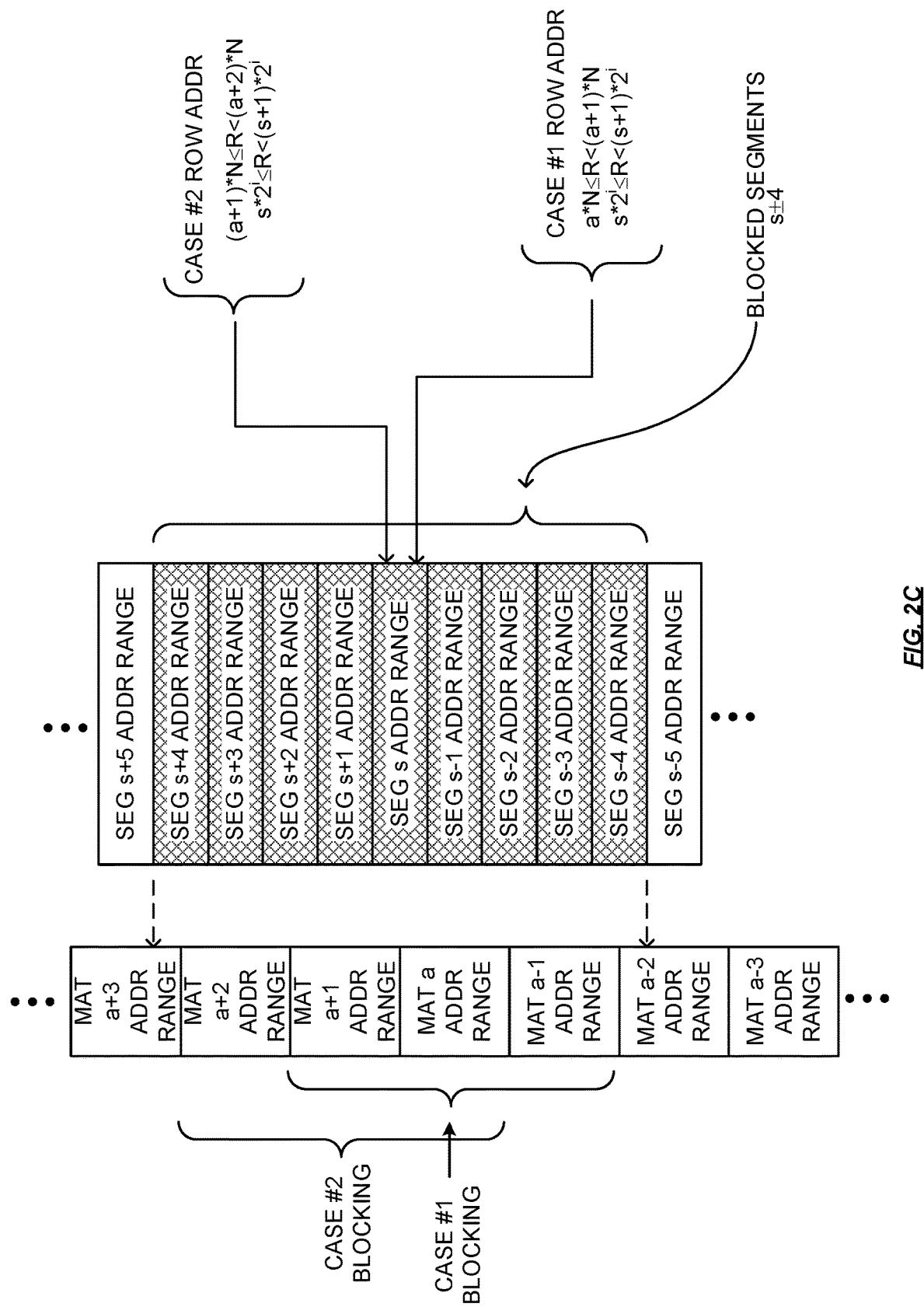

FIGS. 2A-2C are diagrams illustrating blocking segments. In FIG. 2A, example row address ranges associated with MAT a−3 to MAT a+3 are illustrated on vertical scale. Likewise, the row address ranges for example segments s−5 to s+5 (which are each $2^i$ rows in size—i.e., a power of two) are illustrated on the same vertical scale. Note that the segment boundaries do not necessarily coincide with MAT address range boundaries and vice versa. This is illustrated by arrows 202 and 204. Thus, FIGS. 2A-2C may be seen as illustrating a configuration where entries 153-157 correspond to address ranges that are powers of two, but the row addresses associated with each subarray 124-127 do not begin and end on powers of two.

FIG. 2B illustrates example requests to open a row in the segment s address range. Case #1 illustrates a row address that is between rows s*2i and (s+1)*2i (thus making it in the segment s address range) and is also between a*N and (a+1)*N, (thus making it in the MAT a address range) where N is the number of rows in a MAT. Case #2 illustrates a row address that is between rows s*2i and (s+1)*2i (thus making it in the segment s address range), but is instead between (a+1)*N and (a+2)*N, (thus making it in the MAT a+1 address range). Thus, if either of these rows is opened, the MATs that would need to be marked 'blocked' would be: MAT a−1, MAT a, MAT a+1, and MAT a+2.

MAT a−1 would need to be marked blocked because MAT a−1 shares a sense amplifier stripe with MAT a, and case #1 illustrates that opening a row in segment s may result in an open row in MAT a. MAT a would need to be marked blocked because the row to be opened: (a) may be in MAT a (case #1); or (b) may be in MAT a+1 (case #2) and MAT a shares a sense amplifier stripe with MAT a+1. MAT a+1 would need to be marked blocked because the row to be opened: (a) may be in MAT a (case #1) and MAT a+1 shares a sense amplifier stripe with MAT a; or (b) may be in MAT a+1 (case #2). MAT a+2 would need to be marked blocked because MAT a+1 shares a sense amplifier stripe with MAT a+2, and case #2 illustrates that opening a row in segment s may result in an open row in MAT a+1.

To ensure that no rows of MATs a−1, a, a+1, and a+2 are opened while a row in segment s is open, segment s−4 to segment s+4 are marked blocked by controller 110. This is illustrated in FIG. 2C. Thus, blocking, by controller 110, a range of segments (i.e., s±4 segment) around the segment with the open row ensures further row opening operations directed to MATs that are unavailable are not sent to memory 120. By selecting segment sizes to be a power of two (i.e., 2i), controller 120 can use a configured number of the most significant bits of the row address (but not all of the row address bits) as an index to address tables 116-119 to get entries 153-157 and the indicators therein. These bits may be referred to as a segment address and correspond to the value of s in the discussion herein. In an embodiment, memory 120 sends the segment size (i.e., $2^i$ and/or i) and the number of segments to be blocked (e.g., ±4) around an open row to controller 110. Controller 110 stores this configuration 112. Controller uses configuration 112 to operate address tables 116-119.

In an embodiment, a complete address that is transmitted to memory 120 by controller 110 may include fields corresponding to a bank group (BG), bank (BA), segment (s), row (R), and column (C). Some commands may not need to specify a complete address and therefore may only transmit some of these address fields. Table 1 illustrates example address fields for selected commands that may be transmitted to memory 120 when there can be multiple open rows in a bank.

TABLE 1

| Command name | Address fields |
|---|---|
| Activate (ACT) | BG, BA, R |
| Column command (e.g. read or write open row--COL) | BG, BA, s, C |
| Precharge all banks | |

TABLE 1-continued

| Command name | Address fields |
| --- | --- |
| Precharge bank (all segments) | BG, BA |
| Precharge segment (PRE-S) | BG, BA, s |

Table 2 illustrates example timing constraints between example commands when there can be multiple open rows in a bank.

TABLE 2

| Timing constraint name | Description |
| --- | --- |
| $t_{RC}$ | ACT to ACT command in the same bank and blocked segment |
| $t_{RRD}$ | ACT command in bank to ACT command in different bank |
| $t_{RRDa}$ | ACT to ACT command in the same bank and non-blocked segment |
| $t_{CCD}$ | COL command to COL command within the same segment |
| $t_{CCDa}$ | COL command to COL command between non-blocked segments (optional) |
| $t_{FAW}$ | Period for four (4) ACT commands to different banks |
| $t_{FAWa}$ | Period for four (4) ACT commands to segments in the same bank |
| Other | Bank group and rank timing constraints still apply |

Figure 3:
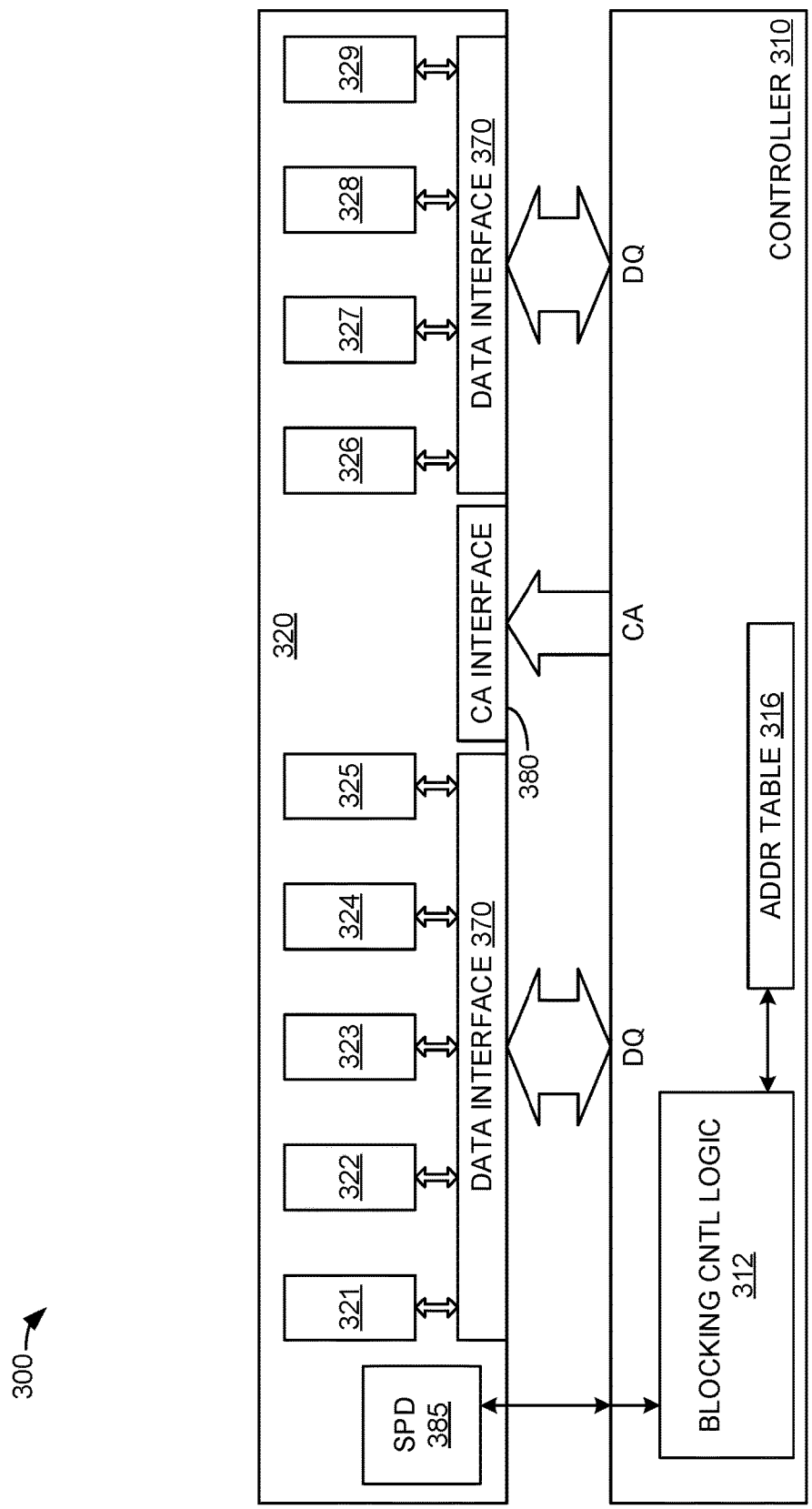
FIG. 3 is a block diagram illustrating a memory module memory system.

FIG. 3 is a block diagram illustrating a memory module memory system. In FIG. 3, memory system 300 comprises controller 310 and memory module 320. Controller 310 may be or correspond to controller 110 discussed herein with reference to FIG. 1. Controller 310 includes blocking control logic 312 and address table 316. Controller 310 is operatively coupled to module 320 via data signals (DQ) and command-address signals (CA). Module 320 includes memory components 321-329, data interface 370, command-address interface 380, and serial presence detect (SPD) circuitry 385. SPD 385 is illustrated as operatively coupled to blocking control logic 312 of controller 310. In an embodiment, configuration information is read from SPD 385. The configuration information read from SPD 385 may include a segment size (e.g., number of rows—preferably a power of two) and the number of surrounding segments (e.g., ±1, ±2, ±3, +1 only, +1, and −3, etc.) to mark as blocked in address table 316 when a row is open in a given segment.

In an embodiment, a memory controller 310 includes address table 316 to associate indicators with row address segments, where the row address segments correspond to respective row address ranges. Blocking control logic 312 sets the indicators to values that associate the respective row address segments as being unavailable for opening a row. Typically, a plurality of the indicators are set in response to the memory controller processing a command to a memory device to open a row. Controller 310 also receives information, from memory 320, that associates row addresses to which of the indicators are to be set in response to the command to the memory device to open a row. This information may be received via SPD 385.

Figure 4:
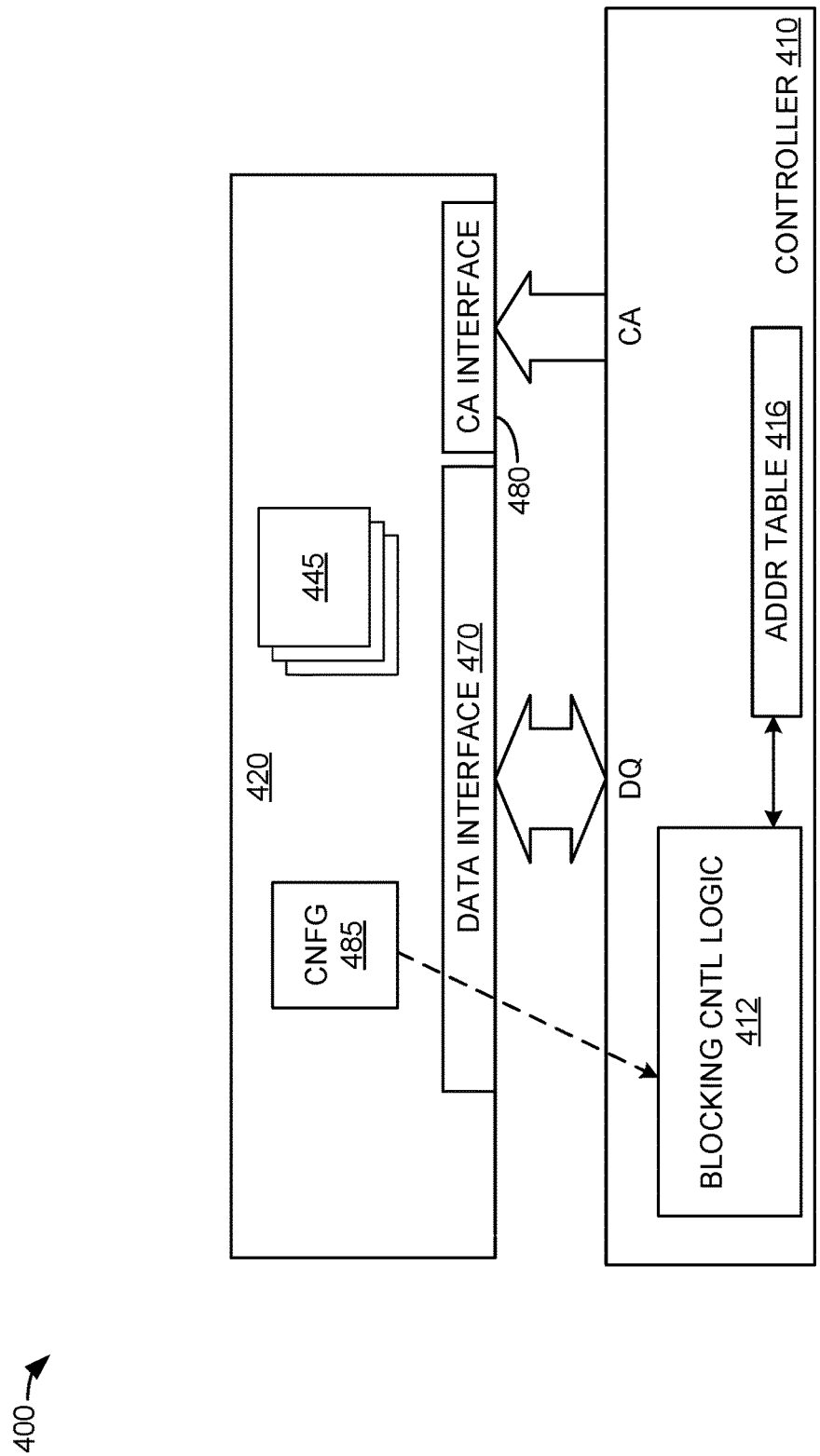
FIG. 4 is a block diagram illustrating a direct attach memory system.

FIG. 4 is a block diagram illustrating a direct attach memory system. In FIG. 4, memory system 400 comprises controller 410 and memory device 420. Controller 410 may be or correspond to controller 110 discussed herein with reference to FIG. 1. Controller 410 includes blocking control logic 412 and address table 416. Controller 410 is operatively coupled to memory 420 via data signals (DQ) and command-address signals (CA). Device 420 includes memory banks (arrays) 445, data interface 470, command-address interface 480, and configuration information circuitry 485. Configuration information circuitry 485 is illustrated as operatively coupled to blocking control logic 412 of controller 410. In an embodiment, configuration information is read from configuration information circuitry 485. Configuration information may be read from configuration information circuitry 485 using, for example, mode register set commands sent by controller 410. The configuration information read from configuration information circuitry 485 may include a segment size (e.g., number of rows—preferably a power of two) and the number of surrounding segments (e.g., ±1, ±2, ±3, +1 only, +1, and −3, etc.) to mark as blocked in address table 416 when a row is open in a given segment.

In an embodiment, a memory controller 410 includes address table 416 to associate indicators with row address segments, where the row address segments correspond to respective row address ranges. Blocking control logic 412 sets the indicators to values that associate the respective row address segments as being unavailable for opening a row. Typically, a plurality of the indicators are set in response to the memory controller processing a command to a memory device to open a row. Controller 410 also receives information, from memory 420, that associates row addresses to which of the indicators are to be set in response to the command to the memory device to open a row. This information may be received from memory device 420.

Figure 5:
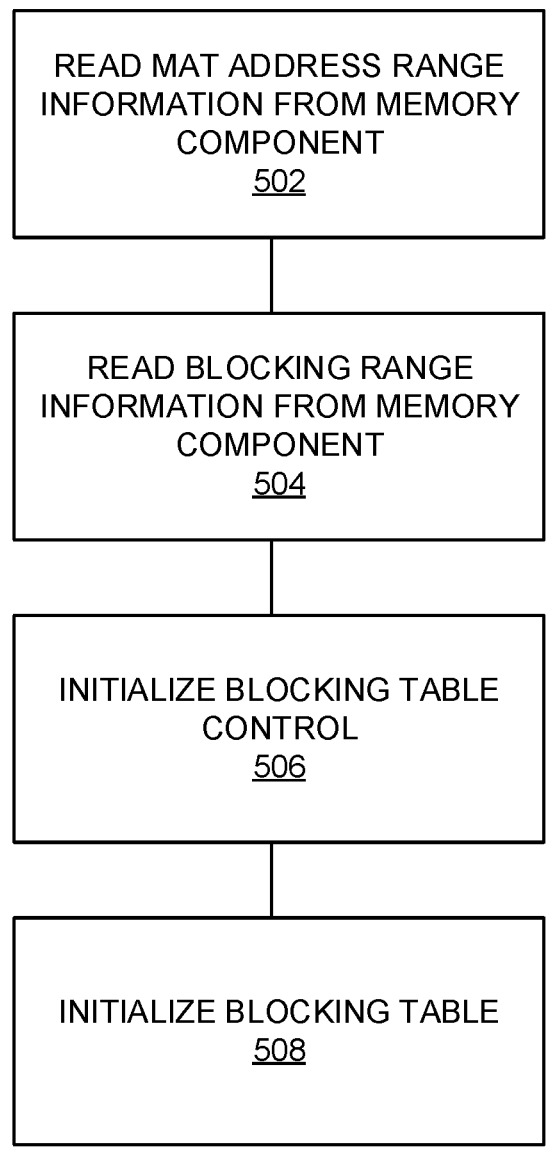
FIG. 5 is a flowchart illustrating a method of configuring a memory controller.

FIG. 5 is a flowchart illustrating a method of configuring a memory controller. The steps illustrated in FIG. 5 may be performed, for example, by one or more elements of system 100, system 300, and/or system 400. MAT address range information is read from a memory component (502). For example, memory controller 310 may read SPD 385 to obtain the size of the address range each entry in address table 316 should block (or unblock.) In another example, memory controller 410 may read configuration information circuitry 485 to obtain the size of the address range each entry in address table 416 should block (or unblock.)

Blocking range information is read from the memory component (504). For example, memory controller 310 may read SPD 385 to obtain the number of segments surrounding an open row that should be marked blocked by entries in address table 316. In another example, memory controller 410 may read configuration information circuitry 485 to obtain the number of segments surrounding an open row that should be marked blocked by entries in address table 416.

Blocking table control is initialized (506). For example, blocking control logic 312 of controller 310 may be initialized with the number of banks, number of segments to be used, the size of the segments (as read from SPD 385), and the number of segments to be blocked around an open row (also read from SPD 385.) In another example, blocking control logic 412 of controller 410 may be initialized with the number of banks, number of segments to be used, the size of the segments (as read from configuration information circuitry 485), and the number of segments to be blocked around an open row (also read from configuration information circuitry 485.)

The blocking table is initialized (508). For example, blocking control logic 312 may initialize address table 316. Address table 316 may be initialized with segment entries that indicate that no segments are blocked. In another example, blocking control logic 412 may initialize address table 416. Address table 416 may be initialized with segment entries that indicate that no segments are blocked.

Figure 6:
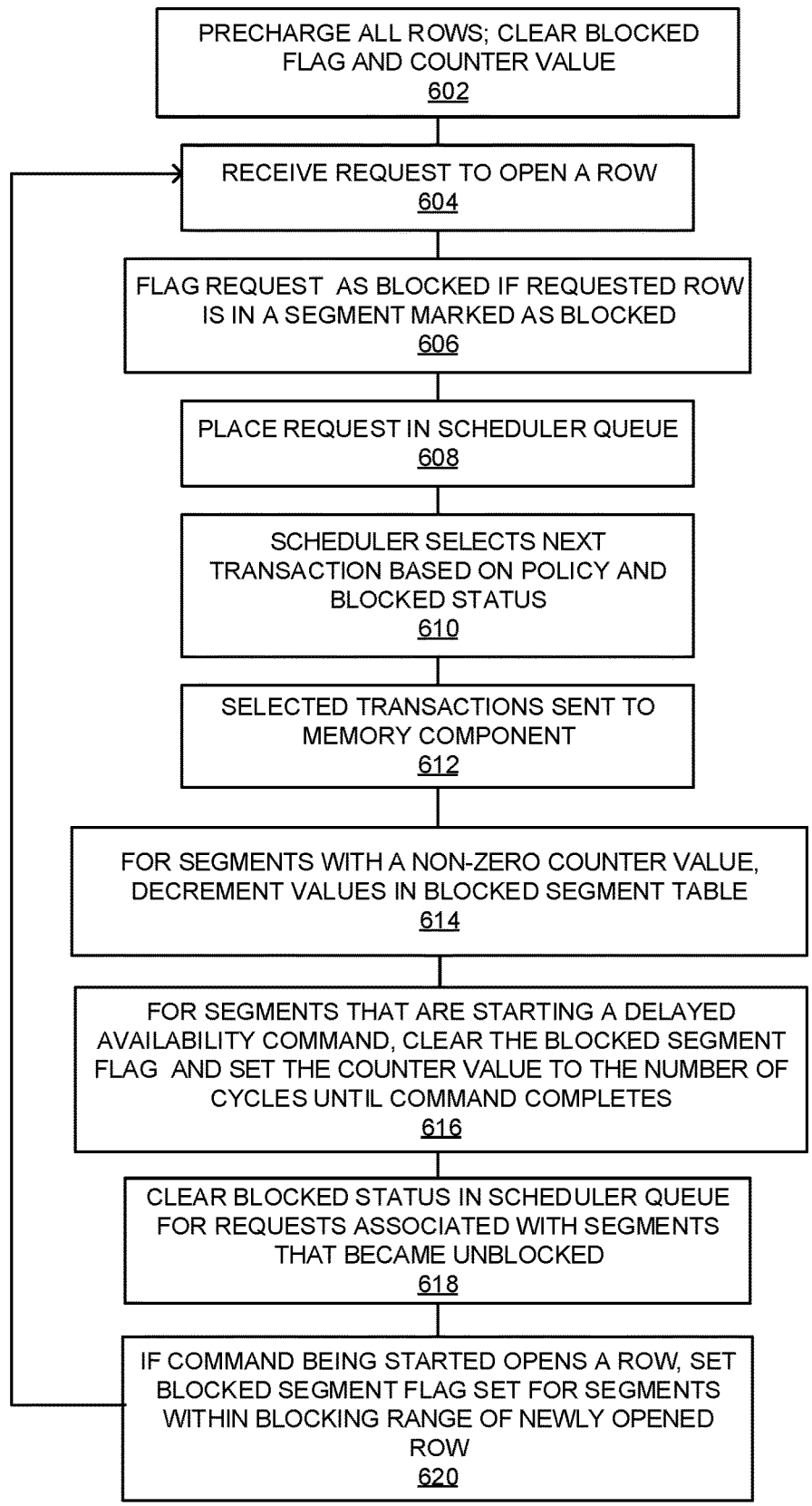
FIG. 6 is a flowchart illustrating a method of operating a memory controller.

FIG. 6 is a flowchart illustrating a method of operating a memory controller. The steps illustrated in FIG. 6 may be performed, for example, by one or more elements of system 100, system 300, and/or system 400. FIG. 7 is a diagram illustrating address table operations. FIG. 7 illustrates example actions and states of an example address table during the operations illustrated in FIG. 6.

All rows are precharged and the blocked flag and counter values are cleared (602). For example, controller 110 may send a command to memory 120 to precharge all of the rows in bank 145. Once the precharge all rows command completes, the entries in the address table are set to states indicating all address ranges are available to be opened. Thus, both the 'blocked' flag and the counter values for all of the address table entries are set to indicate the row is available.

A request to open a row is received (604). For example, scheduler 111 may receive a request that requires controller 110 to open a row in memory 120. The request is flagged as blocked if the requested row is in a segment marked as blocked (606). For example, scheduler 111 may, based on the contents of address table 116, determine that the requested row is blocked. A requested row may be determined to be blocked if either the 'blocked' flag or the counter value in the corresponding address table entry is non-zero.

The request is placed in the scheduler queue (608). For example, scheduler 111 may place the flagged (blocked) request in a scheduler queue. Based on policies and blocked status, the scheduler selects the next transaction (610). For example, based on the blocked status of the request, scheduler 111 may not select the flagged request until it is unblocked.

For entries with a non-zero counter value, the counter values in the segment table are decremented (614). For segments that are starting a delayed availability command, the blocked segment flag is cleared, and the counter value is set to the number of cycles until the command completes (616). For example, the counter values in the entries waiting for a command to complete before they are available are decremented. Non-zero counter values are initially set when commands are issued that cause closing of a row after a known time. Some examples: (1) an explicit precharge command would set the countdown value initially to $t_{RP}$ in length; (2) a write command with auto-precharge would set the countdown to the duration of the column command including $t_{WR}$ for the write plus $t_{RP}$; and, (3) a refresh command would set the countdown to the duration to $t_{RC}$—the duration in a refresh command.

For requests associated with segments that have become unblocked, the blocked status in the scheduler queue is cleared (618). For example, as a result of the count value in one or more entries in address table 116 being decremented, one or more segments that are associated with commands waiting in the scheduler queue may become unblocked.

If command opens a row, the blocked segment flag is set for segments within blocking range of the newly opened row (620). For example, when scheduler 111 sends a command to memory 120 to open a row, scheduler 111 may set the 'blocked' flag for the corresponding range of entries 153-157 in address table 116 to indicate those segments are blocked. Flow proceeds back to box 604.

Figure 7A:
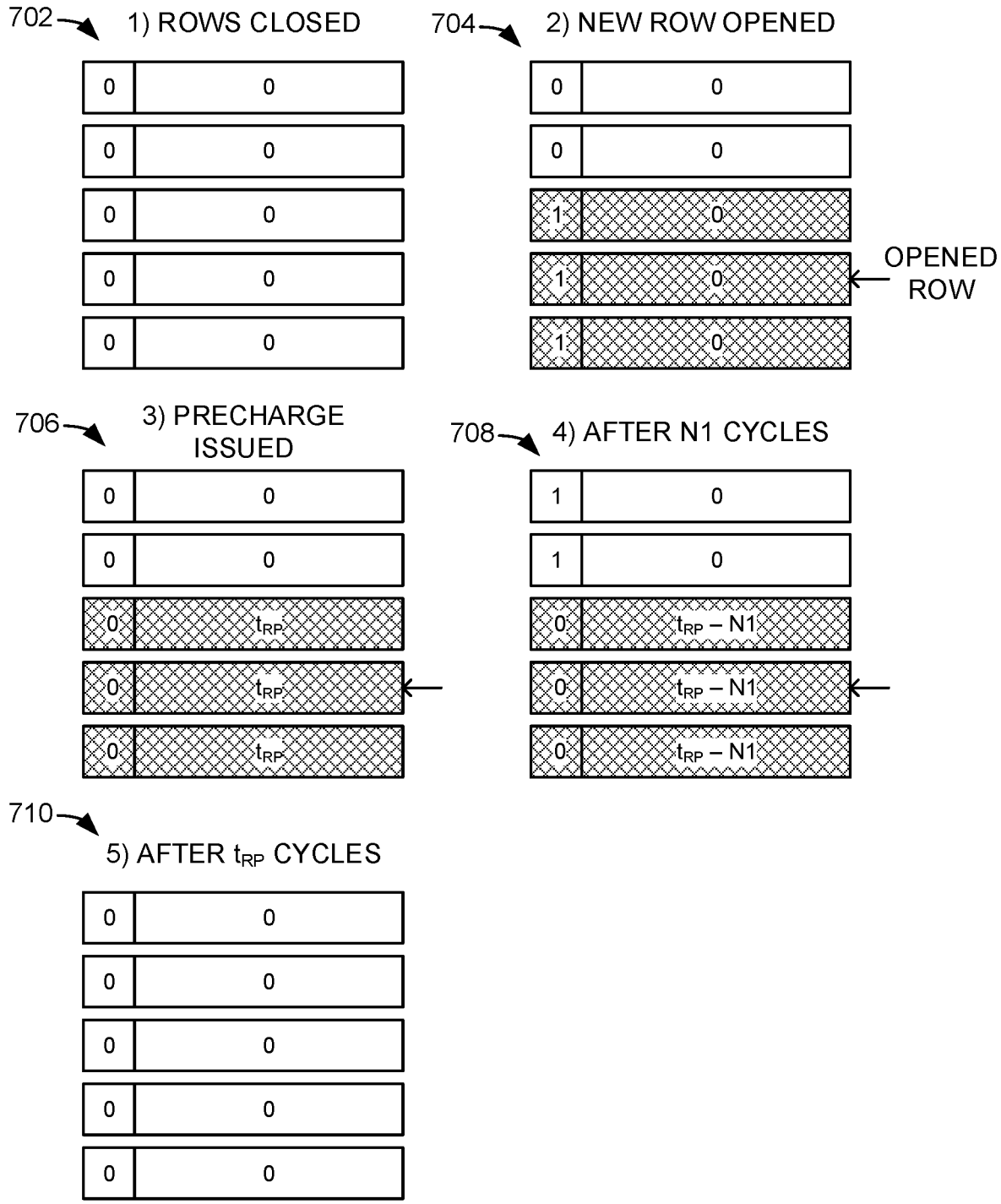
FIGS. 7A-7B are diagrams illustrating address table operations.
Figure 7B:
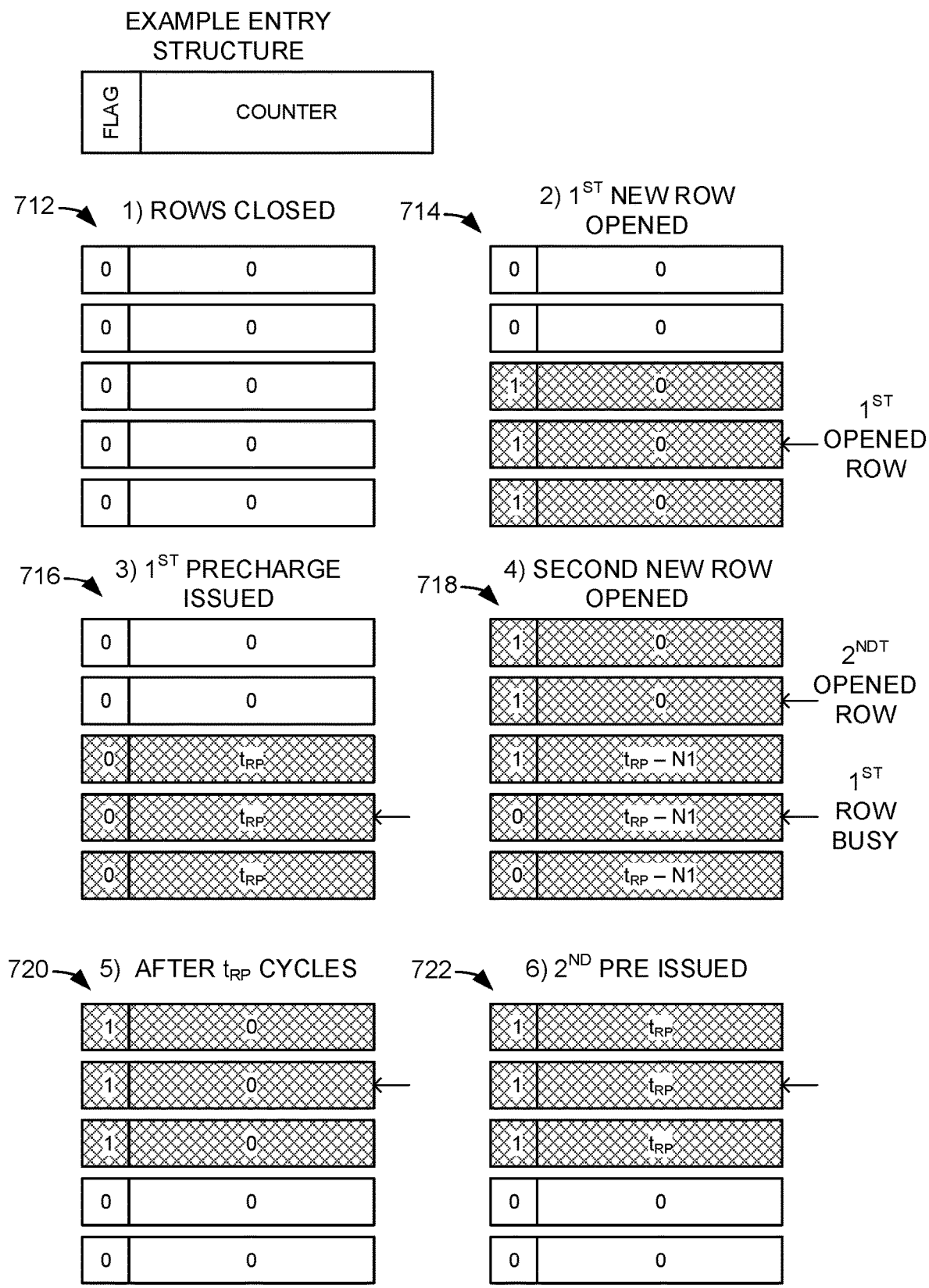

FIGS. 7A-7B are diagrams illustrating address table operations. In FIGS. 7A-7B, address table entries corresponding to blocked address ranges are illustrated in cross-hatch filling.

A first example progression of states and operations for an address table is illustrated in FIG. 7A. In FIG. 7A, the initial state of the address table has no blocked segments. This state is illustrated, for example, by the entries 702 in FIG. 7A storing a '0' entry in both the flag and counter fields of each for each address range (which are not cross-hatch filled.) When a new row is opened, the specified number of segments are marked as blocked by setting the blocked flag in the corresponding address table entries. This state is illustrated, for example, by the entries 704 in FIG. 7A that have a '1' entry in the flag field and a zero (0) in the counter fields (which are cross-hatch filled).

When a precharge command is issued to close the opened row, the flag for the blocked segments is cleared (e.g., set to '0') and the counter field is set to $t_{RP}$. This state is illustrated, for example, by the entries 706 in FIG. 7A that have a '0' entry in the flag field and a $t_{RP}$ initial value in the counter fields (which are cross-hatch filled). After N1 decrement cycles (where $N1<t_{RP}$), the counters in the blocked segments have decreased in value by N1. This state is illustrated, for example, by the entries 708 in FIG. 7A that have a '0' entry in the flag field and a non-zero $t_{RP}$-N1 value in the counter fields (which are cross-hatch filled). After $t_{RP}$ (or more) cycles, the counter fields have saturated at zero and the state of the address table has no blocked segments. This state is illustrated, for example, by the entries 710 in FIG. 7A storing a '0' entry in both the flag and counter fields of each for each address range (which are not cross-hatch filled.)

A second example progression of states and operations for an address table is illustrated in FIG. 7B. In FIG. 7B, the initial state of the address table has no blocked segments. This state is illustrated, for example, by the entries 712 in FIG. 7B storing a '0' entry in both the flag and counter fields of each for each address range (which are not cross-hatch filled.) When a first new row is opened, the specified number of segments are marked as blocked by setting the blocked flag in the corresponding address table entries. This state is illustrated, for example, by the entries 714 in FIG. 7B that have a '1' entry in the flag field and a zero (0) in the counter fields (which are cross-hatch filled).

When a precharge command is issued to close the first opened row, the flag for the blocked segments is cleared (e.g., set to '0') and the counter field is set to $t_{RP}$. This state is illustrated, for example, by the entries 716 in FIG. 7B that have a '0' entry in the flag field and a $t_{RP}$ initial value in the counter fields (which are cross-hatch filled).

After N1 decrement cycles (where $N1<t_{RP}$), a second row is opened that has a segment to be blocked that overlaps one of the segments blocked by the precharge command closing the first opened row. When the second new row is opened, the specified number of segments are marked as blocked by setting the blocked flag in the corresponding address table entries. Also, at the time when the second opened row is opened, the counters for the segments blocked by the precharge operation for the first row have decreased in value by N1. This state is illustrated, for example, by the entries 718 in FIG. 7B (which are cross-hatch filled). It should be understood that, as a matter of design choice, the counter of the 'shared' blocked segment ($3^{rd}$ from the top) could be set to zero when the second row is opened, or the counter could continue to count down.

After $t_{RP}$ (or more) cycles, the counter fields have saturated at zero. Accordingly, the only blocked segments are those whose flag was set by the opening of the second row (which are cross-hatch filled). This state is illustrated, for example, by the entries 720 in FIG. 7B storing a '1' entry in the flag filed and counter fields storing zeros (which are cross-hatch filled.)

When a precharge command is issued to close the second opened row, the flag for the blocked segments is cleared (e.g., set to '0') and the counter field is set to $t_{RP}$. This state is illustrated, for example, by the entries 722 in FIG. 7B that have a '0' entry in the flag field and a $t_{RP}$ initial value in the counter fields (which are cross-hatch filled).

Figure 8:
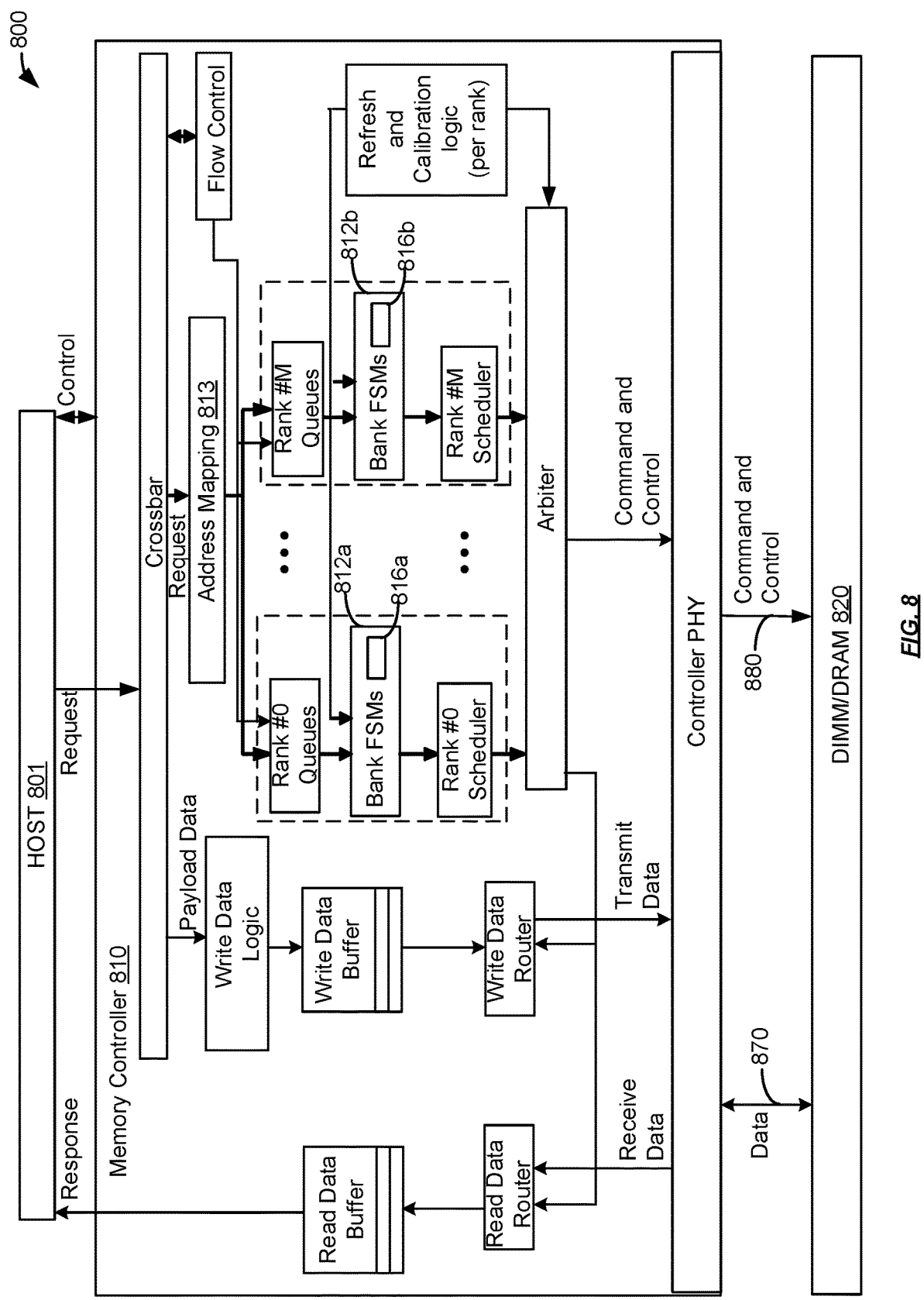
FIG. 8 is a block diagram illustrating a memory system.

FIG. 8 is a block diagram illustrating a memory system. In FIG. 8, memory system 800 comprises memory controller 810, memory component 820, and host 801. Host 801 is operatively coupled to controller 810. Controller 810 is operatively coupled to memory component 820. Controller 810 may be or correspond to controller 110, controller 310, or controller 410 discussed herein with reference to the Figures. Controller 810 includes address mapping 813 and per-bank finite state machines 812a-812b. In an embodiment, address mapping 813 may decode row addresses to segment addresses. In another embodiment, row addresses are related to segment addresses by other circuitry.

When there can be multiple open rows in a bank, bank finite state machines 812a-812b operate to handle the dependencies (e.g., blocked rows, timing constraint within a bank) resulting from having multiple open rows in a bank. For example, bank finite state machines 812a-812b may consider the timing constraints, for example such as those described in Table 2, and the status (e.g., blocked vs. unblocked) of segments when scheduling commands to be sent to memory component 820. Finite state machines 812a-812b may maintain address tables 816a-816b, respectively, in order to determine whether a segment being accessed is blocked. Controller 810 is operatively coupled to memory component 820 via data signals (DQ) and command-address signals (CA). Commands sent to memory component 820 may comprise commands that include a segment address field. The commands and address fields may include, for example, those commands and address fields described in Table 1. An increased number (when compared to a non-multiple open row per-bank configuration) of CA signals and/or command cycles may be used to communicate the segment address field.

Figure 9:
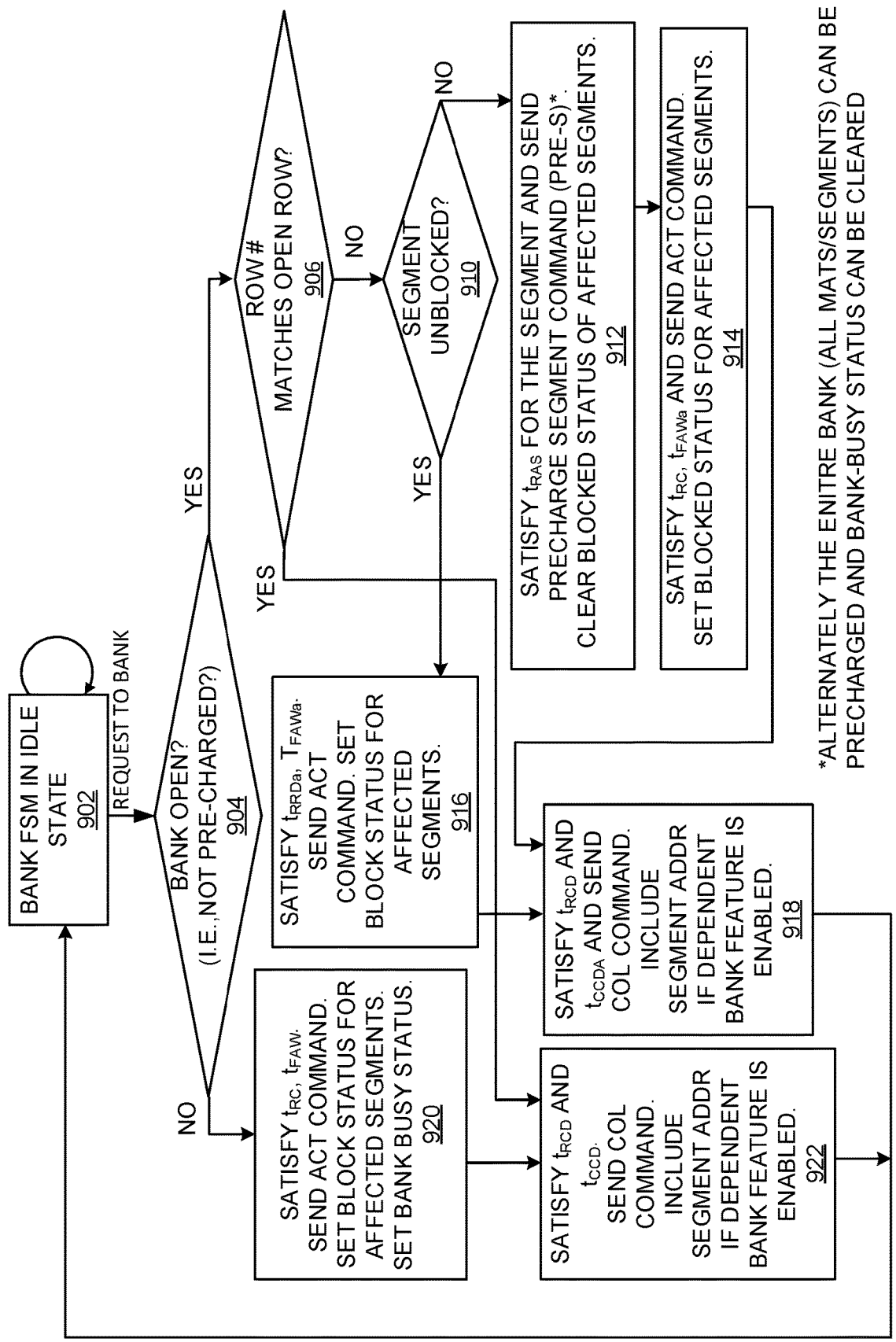
FIG. 9 is a flowchart illustrating a method of operating a memory controller.

FIG. 9 is a flowchart illustrating a method of operating a memory controller. The steps illustrated in FIG. 9 may be performed by one or more of controller 110, controller 310, controller 410, controller 810, and/or their components. A bank finite state machine (FSM) holds in an idle state until a request is received (902). For example, bank FSM 812a may wait until a request is received from host 801. If the requested bank is open (i.e., at least one row is open/not precharged), flow proceed to block 906. Otherwise, flow proceeds to block 920 (904). If the requested row address matches an open row, flow proceeds to box 922. Otherwise, flow proceeds to block 910 (906).

If the row number did not match an open row, and the segment of the requested row is not blocked, flow proceeds to block 916. Otherwise, flow proceeds to block 912 (910). If the segment of the requested row was blocked, a precharge segment (PRE-S) command is sent (after satisfying $t_{RAS}$) and the blocked status of the affected segments is set to unblocked (912). Flow then proceeds to block 914. After $t_{RC}$ and $t_{FAWa}$ have been satisfied, an activate (ACT) command is sent for the requested row and the blocked status is set for the affected segments (e.g., requested segment ±1, ±2, etc.—according to configuration value) (914). Flow then proceeds to block 918.

After $t_{RCD}$ and $t_{CCDa}$ are satisfied, a column command (e.g., read or write) is sent. When multiple open rows per bank is configured, the column command may include a segment address or other tags to identify the row associated with the column command (918). Flow then proceeds back to block 902.

If the segment of the requested row was unblocked, $t_{RRDa}$ and $t_{FAWa}$ are satisfied before sending an activate command for the requested row and setting the status of the affected segments to blocked (916). Flow then proceeds to block 918.

If the bank was not open, $t_{RC}$ and $t_{FAW}$ are satisfied before sending an activate command for the requested row and setting the status of the affected segments to blocked and setting the status of the bank to busy (920). Flow then proceeds to block 922. $t_{RCD}$ and $t_{CCD}$ are satisfied before sending the column command. When multiple open rows per bank is configured, the column command may include a segment address or other tags to identify the row associated with the column command (922). Flow then proceeds back to block 902.

Figure 10:
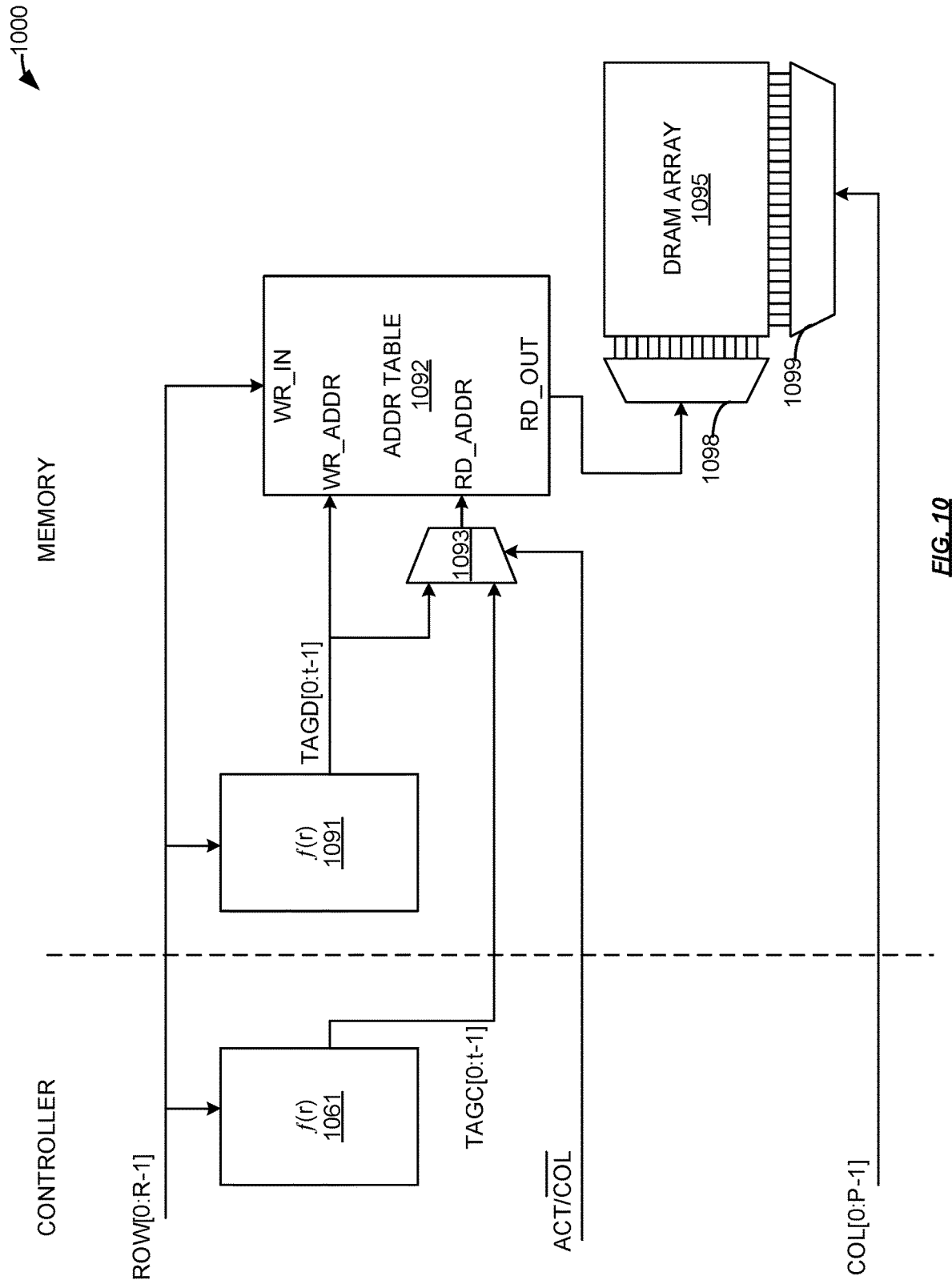
FIG. 10 is a block diagram illustrating open row mapping.
Figure 11:
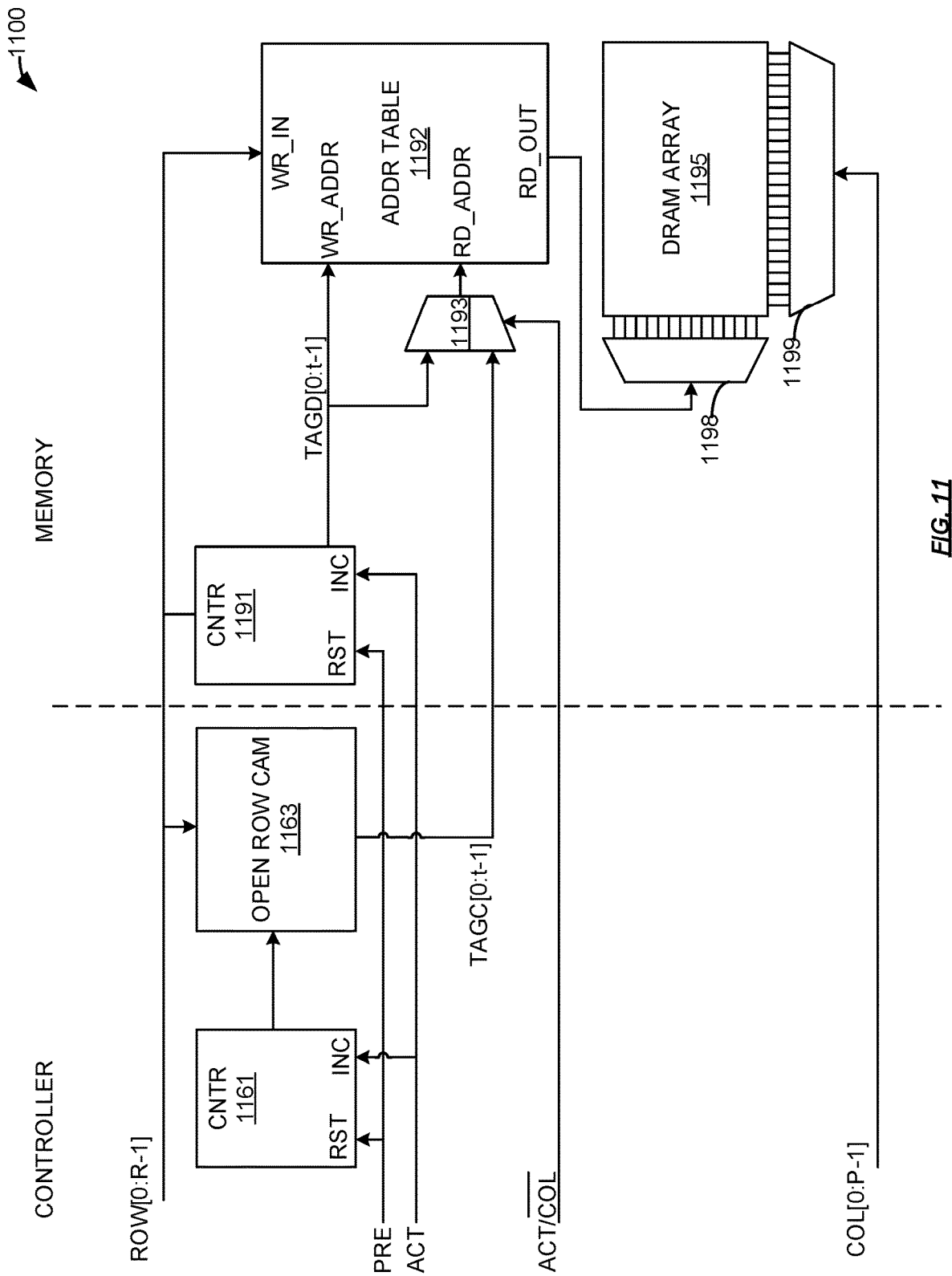
FIG. 11 is a block diagram illustrating open row counter tags.
Figure 12:
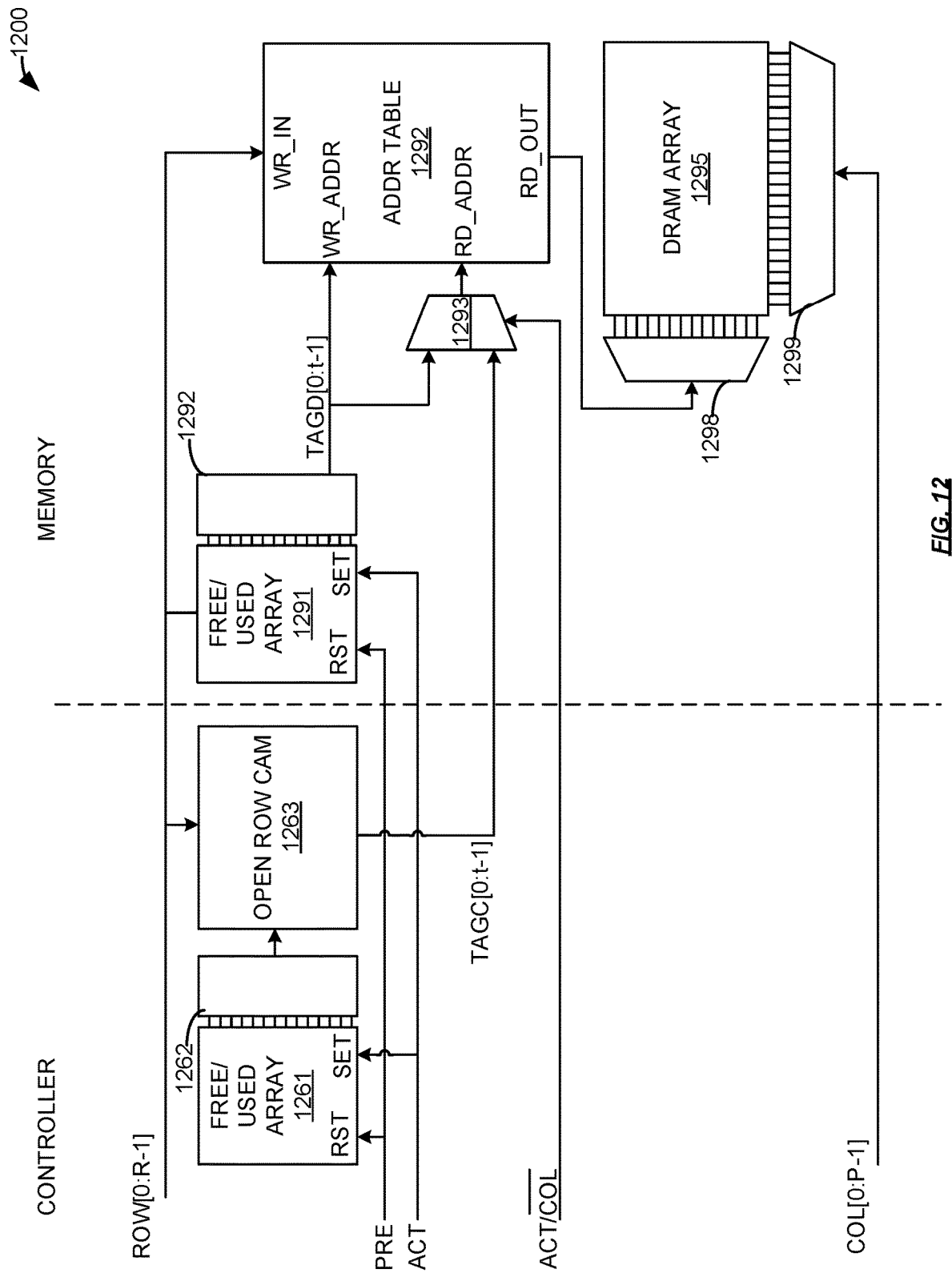
FIG. 12 is a block diagram illustrating dynamic open row tags.

As described herein, when configured, multiple rows may be open in a bank and additional address field bits (e.g., segment address—s) may be needed to specify the open row that is target of the column command. These additional address field bits may require additional cycles and/or additional command/address signals to transmit (when compared to non-multiple open row per-bank operation.) FIGS. 10-12 disclose methods and apparatus for specifying the open row that is target of a column command.

FIG. 10 is a block diagram illustrating open row mapping. In FIG. 10, the controller includes a row address mapping function circuitry 1061. The memory component includes row address mapping function circuitry 1091. Mapping circuitry 1061 and mapping circuitry 1091 implement the same transformation of the row address from R number of row address bits to t number of tag bits, where t is less than R (t<R). The memory component also includes a row address table 1092, multiplexor 1093, DRAM array 1095, row decoder circuitry 1098, and column decoder circuitry 1099.

In operation, mapping system 1000 functions as follows. When a row is opened (e.g., with an activate command—ACT), mapping circuitry 1091 generates, according to the function $f$, t number of tag bits (TAGD[0:t−1]) from the R number of row address bits (or a subset thereof) Examples of this function include extracting a subset of row address bits, and/or a hashing function. Memory uses the tag bits to write the entire row address (ROW[0:R−1]) into row address table 1092 at the address given by the tag bits (TAGD[0:t−1]). The activate command also selects, via multiplexor 1093, the tag bits generated by mapping circuitry 1091 as the read address applied to row address table 1092 thereby passing the current row address (ROW[0:R−1]) to row decoders 1098. Other configurations that do not pass the row address (ROW[0:R−1]) through address table 1092 before being applied to row decoders 1098 are contemplated.

When the controller sends a column operation to the memory, mapping circuitry 1061 generates, according to the same function $f$, t number of tag bits (TAGC[0:t−1]) from the R number of row address bits (or a subset thereof). These tag bits are sent to the memory which uses the received tag bits TAGC[0:t−1] as the read address applied to row address table 1092. Since the function $f( )$ is the same for both mapping circuitry 1061 and mapping circuitry 1091, for the same row address value ROW[0:R−1], the tag bits TAGD [0:t−1] used to write that row address into row address table 1092 for the activate command have the same value as the tag bits TAGC[0:t−1] being used to read a row address from row address table (992) and therefore retrieve, from row address table 1092, the entire row address using just the tag bits TAGC[0:t−1]. The row address read from row address table 1092 is passed to row decoders 1098 as the row to be the subject of the column command.

It should be understood that the function ƒ( ), and/or the controller should manage the aliasing of tag bit values. Aliasing is where two different values of the ROW[0:R−1] bit result in the same tag bit values—TAGC[0:t−1] and/or TAGD[0:t−1]. Thus, row address table 1092 may include additional indicators associated with the row address values to avoid aliasing and/or overwriting valid row addresses (e.g., a 'used' bit for each row address entry.)

FIG. 11 is a block diagram illustrating open row counter tags. In FIG. 11, the controller includes open row count circuitry 1161 and open row content addressable memory (CAM) 1163. The memory component also includes open row count circuitry 1191. Count circuitry 1161 and count circuitry 1191 both increment in response to row activate commands. The value of this count is used as t number of tag bits, where t is less than R (t<R). When the bank is precharged, both count circuitry 1161 and count circuitry 1191 reset their count values to the same value. The memory component also includes a row address table 1192, multiplexor 1193, DRAM array 1195, row decoder circuitry 1198, and column decoder circuitry 1199.

In operation, row counter tag system 1100 functions as follows. When a row is opened (e.g., with an activate command—ACT), count circuitry 1191 supplies (either pre- or post-increment), its count value, TAGD[0:t−1] as t number of tag bits (TAGD[0:t−1]). Controller also increments count circuitry 1161 such that the value output by count circuitry 1161, TAGC[0:t−1] effectively matches the value supplied by count circuitry 1191 at all times. The location of the entry being written into address table 1192, (i.e., TAGC[0:t−1]=TAGD[0:t−1]) is stored in association with the row address ROW[0:R−1] in open row CAM 1163.

Memory uses tag bits TAGC[0:t−1] to write the entire row address (ROW[0:R−1]) into row address table 1192 at the address given by the tag bits (TAGD[0:t−1]). The activate command also selects, via multiplexor 1193, the tag bits TAGD[0:t−1] supplied count circuitry 1191 as the read address applied to row address table 1192 thereby passing the current row address (ROW[0:R−1]) to row decoders 1198. Other configurations that do not pass the row address (ROW[0:R−1]) through address table 1192 before being applied to row decoders 1198 are contemplated.

When the controller sends a column operation to the memory, the row address is applied to open row CAM 1163 which, in turn, supplies the associated tag bits TAGC[0:t−1] that give the location of the entire row address in row address table 1192. These tag bits are sent to the memory which uses the received tag bits TAGC[0:t−1] as the read address applied to row address table 1192. Since count supplied by count circuitry 1161 and count circuitry 1191 is effectively always the same, the tag bits TAGD[0:t−1] used to write that row address into row address table 1192 for the activate command have the same value as the tag bits TAGC[0:t−1] being used to read a row address from row address table 1192 and therefore retrieve, from row address table 1192, the entire row address using just the tag bits TAGC[0:t−1]. The row address read from row address table 1192 is passed to row decoders 1198 as the row to be the subject of the column command.

FIG. 12 is a block diagram illustrating dynamic open row tags. In FIG. 12, the controller includes free/used array 1261, priority encoder 1262, and open row content addressable memory (CAM) 1263. The memory component includes free/used array 1261 and priority encoder 1262. Free/used array 1261 and free/used array 1291 both set and reset their entries in response to the same commands and in the same manner. Thus, the contents (and therefore outputs) of free/used array 1261 and free/used array 1291 are effectively the same at all times. When the bank is precharged, both free/used array 1261 and free/used array 1291 reset their contents to the same value. The memory component also includes a row address table 1292, multiplexor 1293, DRAM array 1295, row decoder circuitry 1298, and column decoder circuitry 1299.

In operation, dynamic tag system 1200 functions as follows. When a row is opened (e.g., with an activate command—ACT), free/used array 1291 supplies an array of bits indicating which entries in address table 1292 are use, and which are free. This array is supplied to priority encode 1292 which selects a free entry in row address table 1292 as the location to store the row address ROW[0:R−1]. The location of the free entry, TAGD[0:t−1], is used as the t number of tag bits. Free/used array 1261 also supplies an array of bits indicating which entries in address table 1292 are used, and which are free. This array is supplied to priority encode 1262 which selects the same free entry as priority encode 1292 selected. The location of the free entry, TAGD[0:t−1] is stored in association with the row address ROW[0:R−1] in open row CAM 1263.

Memory uses tag bits TAGD[0:t−1] to write the entire row address (ROW[0:R−1]) into row address table 1292 at the address given by the tag bits. The activate command also selects, via multiplexor 1293, the tag bits TAGD[0:t−1] supplied count circuitry 1291 as the read address applied to row address table 1292 thereby passing the current row address (ROW[0:R−1]) to row decoders 1298. Other configurations that do not pass the row address (ROW[0:R−1]) through address table 1292 before being applied to row decoders 1298 are contemplated.

When the controller sends a column operation to the memory, the row address is applied to open row CAM 1263 which, in turn, supplies the associated tag bits TAGC[0:t−1] that give the location of the entire row address in row address table 1292. These tag bits are sent to the memory which uses the received tag bits TAGC[0:t−1] as the read address applied to row address table 1292. The row address read from row address table 1292 is passed to row decoders 1298 as the row to be the subject of the column command.

FIG. 13 is a flowchart illustrating a method of controlling a memory device. The steps illustrated in FIG. 13 may be performed by one or more elements of controller 110, controller 310, controller 410, controller 810, and/or their components. From a memory device, information associating row addresses of a DRAM device to respective indicators that are to be set to a first value in response to commands to the DRAM device to open rows is received where the respective indicators are associated with a respective plurality of row address segments, and the row address segments correspond to respective row address ranges (1302). For example, memory controller 310 may read SPD 385 to obtain the size of the address range each entry in address table 316 should block (or unblock) and to obtain the number of segments surrounding an open row that should be marked blocked by entries in address table 316. In another example, memory controller 410 may read configuration information circuitry 485 to obtain the size of the address range each entry in address table 416 should block (or unblock) and to obtain the number of segments surrounding an open row that should be marked blocked by entries in address table 416.

A plurality of the respective indicators are set to the first value, the plurality of the respective indicators being set to the first value in response to at least the memory controller processing a command to the DRAM device to open a first row in the respective row address range associated with at least one of the respective indicators, the first value being associated with the respective associated row address segments being unavailable for opening a second row in the associated respective row address range (1304). For example, controller 110 may set indicators in address table 116 for a range of segments (i.e., s±4) around a segment with an open row thereby ensuring further row opening operations directed to MATs that are unavailable are not sent to memory 120.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, memory system 300, memory system 400, memory system 800, system 1000, system 1100, system 1200, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 14:
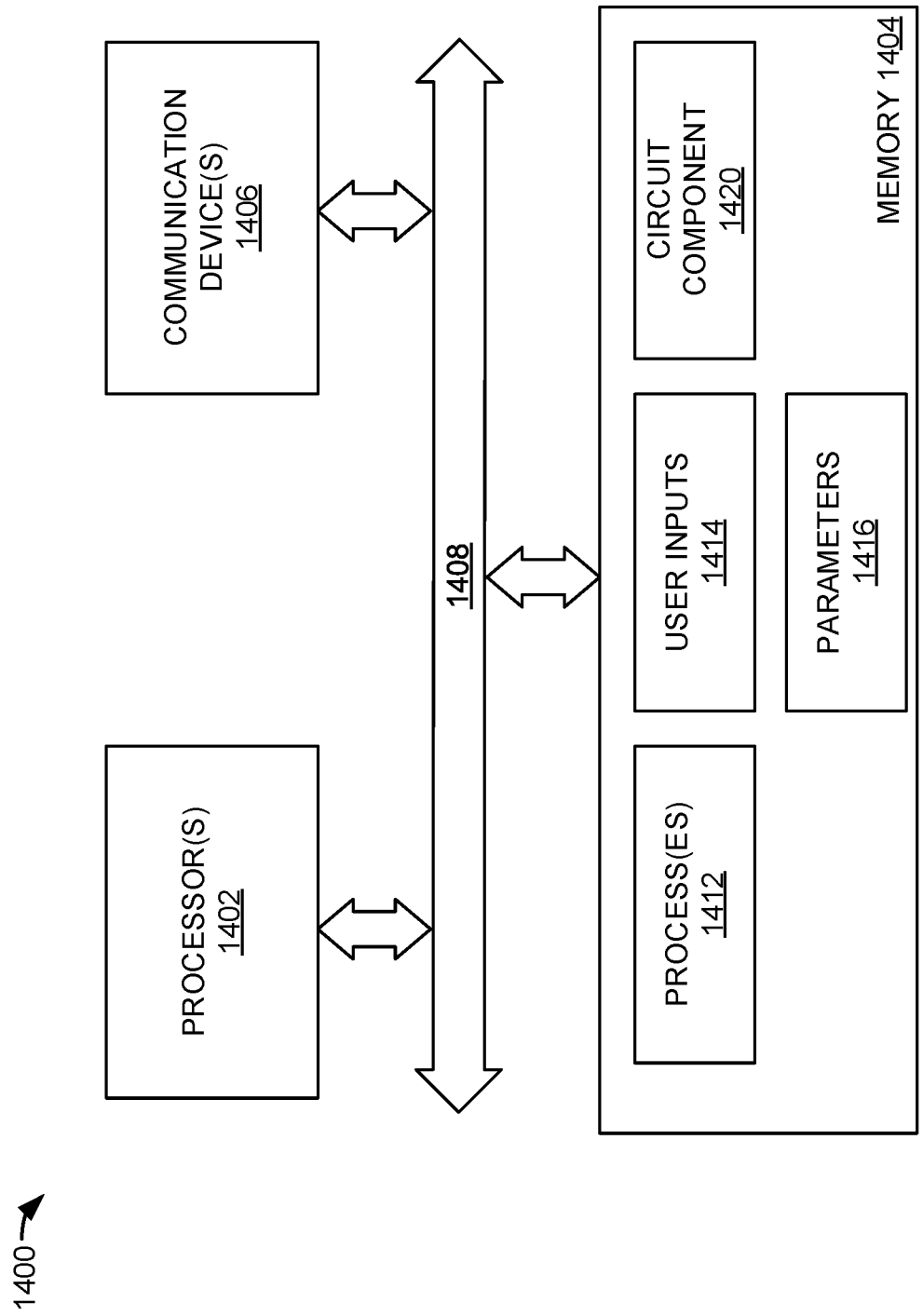
FIG. 14 is a block diagram of a processing system.

FIG. 14 is a block diagram illustrating one embodiment of a processing system 1400 for including, processing, or generating, a representation of a circuit component 1420. Processing system 1400 includes one or more processors 1402, a memory 1404, and one or more communications devices 1406. Processors 1402, memory 1404, and communications devices 1406 communicate using any suitable type, number, and/or configuration of wired and/or wireless connections 1408.

Processors 1402 execute instructions of one or more processes 1412 stored in a memory 1404 to process and/or generate circuit component 1420 responsive to user inputs 1414 and parameters 1416. Processes 1412 may be any suitable electronic design automation (EDA) tool or portion thereof used to design, simulate, analyze, and/or verify electronic circuitry and/or generate photomasks for electronic circuitry. Representation 1420 includes data that describes all or portions of memory system 100, memory system 300, memory system 400, memory system 800, system 1000, system 1100, system 1200, and their components, as shown in the Figures.

Representation 1420 may include one or more of behavioral, register transfer, logic component, transistor, and layout geometry-level descriptions. Moreover, representation 1420 may be stored on storage media or communicated by carrier waves.

Data formats in which representation 1420 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1414 may comprise input parameters from a keyboard, mouse, voice recognition interface, microphone and speakers, graphical display, touch screen, or other type of user interface device. This user interface may be distributed among multiple interface devices. Parameters 1416 may include specifications and/or characteristics that are input to help define representation 1420. For example, parameters 1416 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1404 includes any suitable type, number, and/or configuration of non-transitory computer-readable storage media that stores processes 1412, user inputs 1414, parameters 1416, and circuit component 1420.

Communications devices 1406 include any suitable type, number, and/or configuration of wired and/or wireless devices that transmit information from processing system 1400 to another processing or storage system (not shown) and/or receive information from another processing or storage system (not shown). For example, communications devices 1406 may transmit circuit component 1420 to another system. Communications devices 1406 may receive processes 1412, user inputs 1414, parameters 1416, and/or circuit component 1420 and cause processes 1412, user inputs 1414, parameters 1416, and/or circuit component 1420 to be stored in memory 1404.

Implementations discussed herein include, but are not limited to, the following examples:

Example 1

A memory controller, comprising: circuitry to associate respective indicators with a respective plurality of row address segments, the row address segments corresponding to respective row address ranges; circuitry to set the respective indicators to a first value that is associated with the respective row address segment being unavailable for opening a row in the associated respective row address range, where a plurality of the respective indicators are set to the first value in response to at least the memory controller processing a command to a memory component to open a row in the respective row address range associated with at least one of the respective indicators; and, circuitry to receive information, from a memory component, associating row addresses to which of the respective indicators are to be set to the first value in response to the command to the memory component to open a row.

Example 2

The memory controller of example 1, wherein the memory component is a memory module and the information is communicated via a serial presence detect (SPD) communication channel.

Example 3

The memory controller of example 1, wherein the controller reads the information from a DRAM integrated circuit memory device.

Example 4

The memory controller of example 1, wherein the plurality of the respective indicators correspond to memory sub-arrays that share at least one row of sense amplifiers.

Example 5

The memory controller of example 1, further comprising: circuitry to send, to the memory component, a column access command that communicates information used to select a one of a plurality of concurrently open rows in the memory component.

Example 6

The memory controller of example 5, wherein the information used to select a one of a plurality of open rows in the memory component comprises an index to a row address table on the memory component.

Example 7

The memory controller of example 5, wherein a function applied to the row address is used to generate the index.

Example 8

The memory controller of example 5, wherein a counter generates the index based on a number of activate row commands sent to the memory component since the last precharge command.

Example 9

The memory controller of example 5, further comprising: a table associating row addresses to index values.

Example 10

A memory component, comprising: circuitry to receive commands that result in a plurality of rows of a bank being open concurrently; and, circuitry to receive a column access command that includes information used to select a one of a plurality of concurrently open rows in the memory component.

Example 11

The memory component of example 10, wherein the information used to select the one of the plurality of concurrently open rows includes an index value.

Example 12

The memory component of example 11, further comprising: a row address table that associates index values to row addresses.

Example 13

The memory component of example 12, further comprising: circuitry to apply a function to a received row address to generate an index value used to address the row address table.

Example 14

The memory component of example 11, further comprising: a counter to generate, based on a number of activate row commands received by the memory component since the last precharge command, an index value used to address the row address table.

Example 15

The memory component of example 11, further comprising: a priority encoder to generate, based on a location of an invalid entry in the row address table, an index value used to address the row address table.

Example 16

A method of controlling a memory component, comprising: receiving information, from a memory component, associating row addresses of a DRAM device to respective indicators that are to be set to a first value in response to commands to the DRAM device to open rows, the respective indicators associated with a respective plurality of row address segments, the row address segments corresponding to respective row address ranges; and, setting a plurality of the respective indicators to the first value, the plurality of the respective indicators are set to the first value in response to at least the memory controller processing a command to the DRAM device to open a first row in the respective row address range associated with at least one of the respective indicators, the first value being associated with the respective associated row address segments being unavailable for opening a second row in the associated respective row address range.

Example 17

The method of example 16, further comprising: transmitting, to the DRAM device, at least one command that opens a plurality of rows in the same bank.

Example 18

The method of example 17, further comprising: transmitting, to the memory component, a column access command that communicates information used to select a one of a plurality of concurrently open rows in the memory component.

Example 19

The method of example 18, wherein the information used to select the one of the plurality of concurrently open rows includes an index value.

Example 20

The method of example 19, further comprising: maintaining a table of associations between row addresses and index values.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller, comprising:
   circuitry to associate respective indicators with a respective plurality of row address segments, the row address segments corresponding to respective row address ranges;
   circuitry to set the respective indicators to a first value that is associated with the respective row address segment being unavailable for opening a row in the associated respective row address range, where a plurality of the respective indicators are set to the first value in response to at least the memory controller processing a command to a memory component to open a row in the respective row address range associated with at least one of the respective indicators; and,
   circuitry to receive information, from the memory component, associating row addresses to which of the respective indicators are to be set to the first value in response to the command to the memory component to open a row.

2. The memory controller of claim 1, wherein the memory component is a memory module comprising a plurality of memory devices and the information is communicated via a serial presence detect (SPD) communication channel.

3. The memory controller of claim 1, wherein the controller reads the information from a DRAM integrated circuit memory device.

4. The memory controller of claim 1, wherein the plurality of the respective indicators correspond to memory subarrays that share at least one row of sense amplifiers.

5. The memory controller of claim 1, further comprising:
   circuitry to send, to the memory component, a column access command that communicates information used to select a one of a plurality of concurrently open rows in the memory component.

6. The memory controller of claim 5, wherein the information used to select a one of a plurality of open rows in the memory component comprises an index to a row address table on the memory component.

7. The memory controller of claim 5, wherein a function applied to the row address is used to generate the index.

8. The memory controller of claim 5, wherein a counter generates the index based on a number of activate row commands sent to the memory component since the last precharge command.

9. The memory controller of claim 5, further comprising:
   a table associating row addresses to index values.

10. A method of controlling a memory component, comprising:
    receiving information, from a memory component, associating row addresses of a DRAM device to respective indicators that are to be set to a first value in response to commands to the memory component to open rows, the respective indicators associated with a respective plurality of row address segments, the row address segments corresponding to respective row address ranges; and,
    setting a plurality of the respective indicators to the first value, the plurality of the respective indicators are set to the first value in response to at least the memory controller processing a command to the memory component to open a first row in the respective row address range associated with at least one of the respective indicators, the first value being associated with the respective associated row address segments being unavailable for opening a second row in the associated respective row address range.

11. The method of claim 10, further comprising:
    transmitting, to the memory component, at least one command that opens a plurality of rows in the same bank.

12. The method of claim 11, further comprising:
    transmitting, to the memory component, a column access command that communicates information used to select a one of a plurality of concurrently open rows in the memory component.

13. The method of claim 12, wherein the information used to select the one of the plurality of concurrently open rows includes an index value.

14. The method of claim 13, further comprising:
    maintaining a table of associations between row addresses and index values.

15. A memory controller, comprising:
    control circuitry to set to a first value, respective indicators in an address table that associates respective indicators with a respective plurality of row address segments, the row address segments corresponding to respective row address ranges, the first value to be associated with the respective row address segment being unavailable for opening a row in the associated respective row address range, where a plurality of the respective indicators are set to the first value in response to at least the memory controller processing a command to a memory component to open a row in the respective row address range associated with at least one of the respective indicators; and,
    configuration reading circuitry to receive configuration information, from the memory component, that associates row addresses to respective indicators that are to be set to the first value in response to the command to the memory component to open a row.

16. The memory controller of claim 15, wherein the memory component is a memory module comprising a plurality of memory devices and the configuration information is communicated via a serial presence detect (SPD) communication channel.

17. The memory controller of claim 15, wherein the memory controller reads the configuration information from a DRAM integrated circuit memory device.

18. The memory controller of claim 15, wherein the plurality of the respective indicators correspond to memory subarrays that share at least one row of sense amplifiers.

19. The memory controller of claim 15, further comprising:
   access circuitry to send, to the memory component, a column access command that communicates information used to select a one of a plurality of concurrently open rows in the memory component.

20. The memory controller of claim 19, wherein the information used to select a one of a plurality of open rows in the memory component comprises an index to a row address table on the memory component.

* * * * *